(12) United States Patent
Manabe et al.

(10) Patent No.: US 8,354,171 B2
(45) Date of Patent: *Jan. 15, 2013

(54) BIAXIALLY ORIENTED POLYESTER FILM FOR MOLDED PART

(75) Inventors: Isao Manabe, Otsu (JP); Ryosuke Matsui, Otsu (JP); Masahiro Kimura, Otsu (JP)

(73) Assignee: Toray Industries, Inc. (JP)

( * ) Notice: Subject to any disclaimer, the term of this patent is extended or adjusted under 35 U.S.C. 154(b) by 766 days.

This patent is subject to a terminal disclaimer.

(21) Appl. No.: 12/297,332

(22) PCT Filed: Apr. 17, 2007

(86) PCT No.: PCT/JP2007/058301
§ 371 (c)(1),
(2), (4) Date: Nov. 3, 2008

(87) PCT Pub. No.: WO2007/123095
PCT Pub. Date: Nov. 1, 2007

(65) Prior Publication Data
US 2009/0311493 A1    Dec. 17, 2009

(30) Foreign Application Priority Data
Apr. 19, 2006  (JP) ................. 2006-115307

(51) Int. Cl.
B32B 7/04    (2006.01)
B32B 27/08   (2006.01)
B32B 27/36   (2006.01)
B32B 38/00   (2006.01)
B32B 38/10   (2006.01)

(52) U.S. Cl. ........ 428/458; 428/457; 428/481; 428/910; 156/196; 156/247; 156/344; 264/510; 264/544; 264/241

(58) Field of Classification Search .................. None
See application file for complete search history.

(56) References Cited

U.S. PATENT DOCUMENTS

| | | | |
|---|---|---|---|
| 4,241,129 A * | 12/1980 | Marton et al. ............... 428/216 |
| 4,493,872 A * | 1/1985  | Funderburk et al. .......... 428/332 |
| 4,921,764 A * | 5/1990  | Rudd et al. ................. 428/480 |
| 4,971,860 A * | 11/1990 | Mills et al. ................. 428/332 |
| 5,747,174 A * | 5/1998  | Kimura et al. ............... 428/480 |
| 5,795,527 A   | 8/1998  | Nakamura et al. |
| 6,136,441 A * | 10/2000 | MacGregor et al. .......... 428/412 |
| 6,465,101 B1* | 10/2002 | MacGregor et al. .......... 428/412 |
| 6,565,955 B2  | 5/2003  | Fields et al. |
| 6,610,378 B1* | 8/2003  | Kimura et al. ............... 428/35.8 |
| 6,620,473 B2* | 9/2003  | Nishizawa et al. .......... 428/35.7 |
| 6,670,110 B1* | 12/2003 | Massa et al. ................. 430/494 |
| 6,818,305 B2* | 11/2004 | Murar et al. ................. 428/412 |
| 2003/0190485 A1 | 10/2003 | Takatsuki et al. |
| 2006/0244171 A1* | 11/2006 | Yu et al. ........................ 264/132 |
| 2007/0224433 A1 | 9/2007 | Saitou |
| 2009/0123697 A1* | 5/2009 | Matsui et al. ................. 428/141 |

FOREIGN PATENT DOCUMENTS

| | | | |
|---|---|---|---|
| EP | 1 872 935       | * | 1/2008 |
| JP | 99/08870        |   | 2/1999 |
| JP | 2000-043212     | * | 2/2000 |
| JP | 2000-43212 A    |   | 2/2000 |
| JP | 2000-94575 A    |   | 4/2000 |
| JP | 2001-72841 A    |   | 3/2001 |
| JP | 2001-514984 A   |   | 9/2001 |
| JP | 2002-3624 A     |   | 1/2002 |
| JP | 2002-96439 A    |   | 4/2002 |
| JP | 2002-321277 A   |   | 11/2002 |
| JP | 2002-337297     | * | 11/2002 |
| JP | 2002-337297 A   |   | 11/2002 |
| JP | 2002-338225     | * | 11/2002 |
| JP | 2003-211606 A   |   | 7/2003 |
| JP | 2004-001243 A   |   | 1/2004 |
| JP | 2005-119043 A   |   | 5/2005 |
| JP | 2005-138492     | * | 6/2005 |
| JP | 2005-138492 A   |   | 6/2005 |
| JP | 2005-262447 A   |   | 9/2005 |
| JP | 2005-290094 A   |   | 10/2005 |
| JP | 2005-297283     | * | 10/2005 |
| JP | 2006-051747 A   |   | 2/2006 |
| JP | 2006-281732     | * | 10/2006 |
| WO | 2005/051660 A1  |   | 6/2005 |
| WO | 2006/104116 A1  |   | 10/2006 |

OTHER PUBLICATIONS

Gupta, V.B. et al. "Effect of Processing History on Shrinkage Stress in Axially Oriented Poly(ethylene terephthalate) Fibres and Films,"*Polymer, Elsevier Science Publishers B.V. GB*, Jun. 1, 1994, vol. 35, No. 12, pp. 2560-2567 (Abstract only).

* cited by examiner

*Primary Examiner* — Vivian Chen
(74) *Attorney, Agent, or Firm* — DLA Piper LLP (US)

(57) ABSTRACT

A biaxially oriented polyester film is provided, in particular, a biaxially oriented polyester film for molded part capable of being used suitably as a metallic molded part processed after metal deposition on a film surface and a surface protection film in forming a decorative sheet. Provided is a biaxially oriented polyester film for molded part, which is a polyester film that at least two layers of A layer composed of polyester A and B layer composed of polyester B are laminated, wherein
  interlayer adhesion between A layer and B layer is 5 (N/15 mm) or more, and
  stress at 100% elongation (F100 value, unit: MPa) at 200° C. and 150° C. in the longitudinal direction and transverse direction of a film is 1 to 50.

15 Claims, No Drawings

BIAXIALLY ORIENTED POLYESTER FILM FOR MOLDED PART

RELATED APPLICATIONS

This is a §371 of International Application No. PCT/JP2007/058301, with an international filing date of Apr. 17, 20077 (WO 2007/123095 A1, published Nov. 1, 2007), which is based on Japanese Patent Application No. 2006-115307, filed Apr. 19, 2006.

TECHNICAL FIELD

The present invention relates to a biaxially oriented polyester film, specifically to a biaxially oriented polyester film for molded part capable of being used suitably as a metallic molded part processed after metal deposition on a film surface, and a surface protection film in forming a decorative sheet.

BACKGROUND

Recently, in building materials, automobile components, cellular phones and electric products, a lot of parts with a metallic appearance by plating an injection-molding article of resin, and highly decorative parts by coating are being used. Being accompanied by increasing concerns about environment problems, plating liquids in a chemical bath in plating a resin, solvents discharged in a painting process, and influences that carbon dioxide affects environment are seen as a problem. In particular, attempts to prevent leak of plating liquids are necessary, farther, movements to regulate plating liquid itself have been coming out.

In such situations, as a metallic molded part replacing plating, there is proposed a laminate that metal deposition is done on a polyester film, and laminated on other material (Japanese Unexamined Patent Publication No. 2000-43212). However, since this proposal uses an ordinary biaxially stretched polyester film, it is not possible to produce a molded part with a complicated shape like plating an injection-molding article. Disclosed is an excellently decorative part that a metallic printing layer is formed on a polyester film, which in turn is thermally transferred to a molded article (Japanese Unexamined Patent Publication No. 2005-119043). However, since this proposal discards a polyester film after transferring the metallic printing layer, it is not economical and has a problem that environmental loads become large. Further, a proposal of a metallic decorative sheet that a metal thin film layer is formed on a formable film, and processed after lamination (Japanese Unexamined Patent Publication Nos. 2004-1243 and 2005-262447). However, these proposals do not satisfy the requirement of appearance after forming when a polyester film is used, and when an acryl type film is used emphasizing appearance, adhesion to the metal layer is not sufficient and a primer layer needs to be formed, and no satisfactory level is achieved.

On the other hand, several proposals of polyester film usable in such metallic formable film are done. First, a polyester film consisting of polyethylene terephthalate as a main constitutional component and containing other composition is disclosed (Japanese Unexamined Patent Publication No. 2000-94575). However, this proposal is far from demand characteristics on formability and appearance after forming as well. Next, a polyester film with excellent formability having a specific melting point and tensile elongation at break is also proposed (Japanese Unexamined Patent Publication No. 2001-72841). However, since a film of this proposal has too high strain stress in processing, it is difficult to carry out thermoforming precisely. Further, a film that polyethylene terephthalate and polybutylene terephthalate are mixed by 1:1 to provide formability is disclosed (Japanese Unexamined Patent Publication No. 2002-321277). However, it is difficult to obtain a beautiful metallic film by this film. Further, a polyester film for molded part having a specific melting point and adopting a specific film making condition is also disclosed (Japanese Unexamined Patent Publication No. 2003-211606). However, in a film of this proposal, metallic brightness after forming is lowered as expected, and appearance point of view is not sufficient.

In order to satisfy formability, decorative effect and smoothness, in a laminated film of three layers of A layer, B layer and C layer, a polyester film having formability by the B layer being an intermediate layer is proposed (Japanese Unexamined Patent Publication No. 2006-51747). However, this polyester film is inferior in interlayer adhesion between the B layer being an intermediate layer and the A layer, C layer being a surface layer, so that delamination occurs easily after processing.

Movements that a decorative sheet is used for a molded article as an alternative for coating are active. By using a decorative sheet, a method carrying out vacuum forming, vacuum pressure forming, plug assist forming or the like is used. In this case, however, in severe forming processes such as heating, pushing a metal mold and vacuuming, there are problems that surface is scared and surface gloss is lowered. Therefore, there is a proposal that a thermoformable masking film is laminated (Japanese Translation of PCT Publication No. 2001-514984).

However, since a masking film of this proposal is a non-oriented urethane film directly casting on a decorative sheet, hardness of film is too low, peel property after forming and surface conditions of a decorative sheet after forming are insufficient.

As a metallic easily formable decorative sheet, to prevent scar in forming, a formable laminate that a masking layer is laminated is proposed (U.S. Pat. No. 6,565,955). As a masking layer, a high elongation film such as polyester, nylon and polyurethane is proposed. However, in this proposal, since stress in forming is not sufficiently low, in forming a formable laminate, forming compliance is insufficient, and peel property after forming is bad, thus, there has been a problem that fragment of a protection film remains on the surface of a metallic easily formable decorative sheet.

It could therefore be helpful to provide a biaxially oriented polyester film preferably used as a metallic molded part because of having heat resistance and dimensional stability capable of forming a metal thin film, thermofomability and an excellent metallic appearance after forming, and no delamination between layers in a film after thermoforming. It could also be helpful to provide a biaxially oriented polyester film preferably used as a surface protection film of decorative sheets such as paint film because appearance of a molded article can be maintained beautifully when used as a surface protection film in forming a formable decorative sheet.

SUMMARY

We provide:
(1) A biaxially oriented polyester film for molded part, which is a polyester film that at least two layers of A layer composed of polyester A and B layer composed of polyester B are laminated, wherein
interlayer adhesion between A layer and B layer is 5N/15 mm or more, and stress at 100% elongation (F100 value) at 200° C. and 150° C. in the longitudinal direction and transverse direction of a film is 1 to 50 Mpa;

(2) The biaxially oriented polyester film for molded part described in (1), which is constituted by three layers of A layer/B layer/C layer;

(3) The biaxially oriented polyester film for molded part described in (1) or (2), wherein interlayer adhesion between A layer and B layer after being stretched at 200° C. by 1.2 times in the longitudinal direction and transverse direction of a film is 3 N/15 mm or more;

(4) The biaxially oriented polyester film for molded part described in any one of (1) to (3), wherein a small endotherm peak before crystal melting obtained by a differential scanning calorimeter measurement is present in a range of 220° C. to 255° C.;

(5) The biaxially oriented polyester film for molded part described in any one of (1) to (3), wherein glycol residue components constituting polyester B are the following constitution:
glycol residue component Ba: ethylene glycol residue of 60 to 90 mole %,
glycol residue component Bb1: 1,4-butanediol residue of 9 to 40 mole %, and
glycol residue component Bb2: other glycol component different from Ba and Bb1 of 1 to 20 mole %;

(6) The biaxially oriented polyester film for molded part described in (5), wherein glycol residue component Bb2 contains 1,4-cyclohexanedimethanol residue component;

(7) The biaxially oriented polyester film for molded part described in any one of (1) to (5), wherein glycol residue components constituting polyester A are the following constitution:
glycol residue component Aa: ethylene glycol residue of 60 to 90 mole %, and
glycol residue component Ab: other glycol component different from glycol residue component Aa of 10 to 40 mole %;

(8) The biaxially oriented polyester film for molded part described in any one of (1) to (7), wherein glycol residue components constituting polyester A are the following constitution:
glycol residue component Aa: ethylene glycol residue of 60 to 90 mole %,
glycol residue component Ab1: 1,4-butanediol residue of 9 to 40 mole %, and
glycol residue component Ab2: other glycol component different from Aa and Ab1 of 1 to 20 mole %;

(9) The biaxially oriented polyester film for molded part described in (8), wherein glycol residue component Ab2 contains 1,4-cyclohexanedimethanol residue component;

(10) The biaxially oriented polyester film for molded part described in any one of (1) to (9), wherein tensile elongation at break at 200° C. and 150° C. in the longitudinal direction and transverse direction of a film is 150 to 400%;

(11) The biaxially oriented polyester film for molded part described in any one of (1) to (10), wherein haze is 0.01 to 0.2%/μm;

(12) The biaxially oriented polyester film for molded part described in any one of (1) to (11), wherein heat-shrinkable stress at 200° C. in the longitudinal direction and transverse direction is 0 to 0.16 Mpa;

(13) A film for metallic molded part, wherein a metal compound is deposited on at least one surface of the biaxially oriented polyester film for molded part described in any one of (1) to (12);

(14) The biaxially oriented polyester film for molded part described in any one of (1) to (12), which is used by being laminated on a surface of a formable decorative sheet;

(15) A formable laminate, wherein the biaxially oriented polyester film for molded part described in any one of (1) to (12) is laminated on a surface of a formable decorative sheet;

(16) A forming method of molded part, wherein the formable laminate described in (15) is preformed, after trimming, a resin is injected to peel said biaxially oriented polyester film for molded part; and

(17) A molded part which is obtained by peeling said biaxially oriented polyester film for molded part after the formable laminate described in (15) is formed, wherein an absolute value of difference in surface gloss from a formable decorative sheet before forming is less than 10.

The biaxially oriented polyester film for molded part of the present invention is easy to process by thermoforming and excellent in heat dimensional stability, thus, metal deposition can be easily carried out uniformly, further, appearance change of film before and after thermoforming is small, no delamination between layers occurs, so that it can be used suitably for a metallic mold part, a surface protection film in forming a formable decorative sheet and so on.

DETAILED DESCRIPTION

A polyester resin constituting a polyester film of the present invention is a collective term of polymer compound whose main bond in a main chain is a polyester bond, and it can be generally obtained by polycondensation reaction of dicarboxylic components with glycol components.

In the present invention, from the points of formability, appearance, heat stability and economic efficiency, polyester A preferably contains a polyethylene terephthalate resin of 10 to 100% by mass based on the total polyester A of 100% by mass. In order to improve formability and interlayer adhesion, other polyester resin may be added to a polyethylene terephthalate resin, and a copolymerizable component may be copolymerized within a degree not damaging heat resistance.

As a polyester resin that is added to the polyethylene terephthalate, there can be listed polybutylene terephthalate, polytrimethylene terephthalate, polyethylene 2,6-naphthalenedicarboxylate, poly(1,4-cyclohexanedimethyl terephthalate), polyethylene isophthalate, polybutylene 2,6-naphthalenedicarboxylate, and their copolymers. Among them, polybutylene terephthalate, poly(1,4-cyclohexanedimethyl terephthalate) and their copolymers, in particular, copolymers with polyethylene terephthalate can be preferably used.

As a copolymerizable component with polyethylene terephthalate, there are listed aliphatic dihydroxy compounds such as 1,2-propanediol, 1,3-propanediol, 1,3-butanediol, 1,4-butanediol, 1,5-pentanediol, 1,6-hexanediol and neopentyl glycol; polyoxyalkylene glycols such as diethylene glycol, polyethylene glycol, polypropylene glycol and polytetramethylene glycol; alicyclic dihydroxy compounds such as 1,4-cyclohexanedimethanol; and aromatic dihydroxy compounds such as bisphenol A and bisphenol S. As a preferable dicarboxylic component, there can be listed aromatic dicarboxylic acids such as 2,6-naphthalene dicarboxylic acid, isophthalic acid, diphenyldicarboxylic acid, diphenylsufone dicarboxylic acid, diphenoxyethane dicarboxylic acid, 5-sodiumsulfone dicarboxylic acid and phthalic acid; aliphatic dicarboxylic acids such as oxalic acid, succinic acid, adipic acid, sebasic acid, dimer acid, maleic acid and fumaric acid; alicyclic dicarboxylic acids such as 1,4-cyclohexane dicarboxylic acid; and oxy dicarboxylic acids such as para-oxy benzoic acid. As dicarboxylate derivatives, esters of the above-described dicarboxylic acid compounds, for example, there can be listed dimethyl terephthalate, diethyl terephthalate, ethyl methyl 2-hydroxyterephthalate, dimethyl 2,6-naphthalenedicarboxylate, dimethyl isophthalate, dimethyl adipate, diethyl maleate, dimer acid dimethyl ester and the like.

Among these, as copolymerizable components, there can be preferably used 2,6-naphthalenedicarboxylic acid, isophthalic acid or their dimethyl ester derivatives as dicarboxylic acid compounds; and 1,3-propanediol, 1,4-butanediol, and 1,4-cyclohexanedimethaol as glycol compounds.

In the polyester film of the present invention, glycol residue components constituting polyester A are particularly preferably the following constitution; glycol residue component Aa: ethylene glycol residue of 60 to 90 mole %, and glycol residue component Ab: other glycol component different from glycol residue component Aa of 10 to 40 mole %. Being composed of such composition is preferable from the viewpoints of satisfying both formability and beauty of appearance. Further, from the point of high formability, glycol residue components constituting polyester A are preferably the following constitution; glycol residue component Aa: ethylene glycol residue of 60 to 90 mole %, glycol residue component Ab1: 1,4-butanediol residue of 9 to 40 mole %, and glycol residue component Ab2: other glycol component different from Aa and Ab1 of 1 to 20 mole %. Glycol residue component Ab2 is not particularly limited, it may be a plurality of glycol residue components, but from the points of formability, beauty of appearance and economic efficiency, 1,4-cyclohexanedimethanol, neopentyl glycol and 1,3-propanediol are preferably used, among them, containing a 1,4-cyclohexanedimethanol residue component is particularly preferable from the point of transparency. In addition, a diethylene glycol residue component generated as a by-product in production step of polyethylene terephthalate is included thereto.

A glass transition temperature of polyester A of the present invention is preferably 50 to 90° C. When the glass transition temperature of polyester A is less than 50° C., there is a case that film adheres on a heating roll upon film production and a striped unevenness is generated in the longitudinal direction of a film, thereby affecting the appearance. On the other hand, when the glass transition temperature is more than 90° C., it is not preferable because there is a case that formability is affected. The glass transition temperature is more preferably 55 to 90° C., and further preferably 60 to 90° C. It is further preferably 60 to 87° C., and most preferably 60 to 85° C. The glass transition temperature herein can be obtained in accordance with JIS K7121 (1987) from heat flux gap in rising temperature in a differential scanning calorimetric analysis.

In the present invention, from the point of formability, polyester B is preferably 10 to 90% by mass of polyethylene terephthalate type resin, 10 to 90% by mass of polybutylene terephthalate type resin and/or polytrimethylene terephthalate type resin, and 0 to 50% by mass of other polyester resin based on 100% by mass of the total polyester B. Although polyester B consisting of two components of polyethylene terephthalate type resin and polybutylene terephthalate type resin for example may shows high formability, being composed of polyester with three components or more is preferable because formability is further enhanced.

Glycol residue components of polyester B used in B layer constituting a polyester film of the present invention are preferably the following constitution from the viewpoints of exhibiting excellent formability; glycol residue component Ba: ethylene glycol residue of 60 to 90 mole %, glycol residue component Bb1: 1,4-butanediol residue of 9 to 40 mole %, and glycol residue component Bb2: other glycol component different from Ba and Bb1 of 1 to 20 mole %. Other glycol residue is not particularly limited, it may be a plurality of glycol residue components, but from the points of formability, beauty of appearance and economic efficiency, 1,4-cyclohexanedimethanol, neopentyl glycol and 1,3-propanediol are preferably used, among them, containing a 1,4-cyclohexanedimethanol residue component is particularly preferable from the point of transparency. Glycol residue components of polyester B are preferably the following constitution from the point of formability; glycol residue component Ba: ethylene glycol residue of 60 to 90 mole %, glycol residue component Bb1: 1,4-butanediol residue of 10 to 30 mole %, and glycol residue component Bb2: other glycol component different from Ba and Bb1 of 1 to 30 mole %. Other glycol component may be a plurality of glycol residue components, and a diethylene glycol residue component generated as a by-product in production step of polyethylene terephthalate is included in glycol residue component Bb2.

The melting point of polyester B of the present invention is preferably 220 to 255° C. When the melting point is more than 255° C., since heat resistance is too high, strain stress is too high upon a secondary processing of film, so it becomes difficult to process into a complicated shape. On the other hand, when the melting point of polyester B is less than 220° C., B layer becomes an amorphous state depending on heat treatment temperature in a film production process, which makes a film breakable even when a tension is just loaded to transport a film. When the heat treatment temperature is lowered, dimensional stability deteriorates, leading to an unfavorable state as a film for molded part. The melting point of polyester B is more preferably 225 to 250° C., and most preferably 230 to 248° C. The melting point herein is a temperature of an endotherm peak exhibited by melting phenomenon upon measuring at a heating speed of 20° C./min by using a differential scanning calorimeter. When a film is produced using a blend of polyester resins with different compositions, there is a case that endotherm peaks accompanied by a plurality of melting appear, in this case, an endotherm peak which appears at the highest temperature is defined as the melting point.

The biaxially oriented polyester film for molded part of the present invention needs to laminate at least two layers of A layer composed of polyester A and B layer composed of polyester B for satisfying formability, appearance and handleability.

In the present invention, to obtain good windability of film, it is preferable to add lubricant particles, but it is preferable for the added amount of particle to be as low as possible for maintaining transparency, thus, adding particles only to A layer or B layer of polyester can give lubricity to at least one surface of a film, which can satisfy both handleability and transparency.

The biaxially oriented polyester film for molded part of the present invention is preferably a three-layer constitution of A layer/B layer/C layer for further improving formability, appearance and handleability. In this case, polyester C composing C layer preferably has a glass transition temperature of 50 to 90° C., more preferably 55 to 90° C., and further preferably 60 to 90° C. similar to polyester A for preventing it from adhesion onto a heating roll upon film production. Being 60 to 87° C. is further preferable and 60 to 85° C. is most preferable. Preventing C layer from adhesion onto a heating roll upon film production is very preferable because excellent appearance of both film surfaces can be achieved.

It is possible to give lubricity to both film surfaces by adding lubricant particles only to A layer and C layer in a three-layer constitution of A layer/B layer/C layer and to satisfy transparency as well, which is a preferable mode.

Polyester composing C layer is preferably polyester A from the viewpoint of economic efficiency and productivity. For further improving economic efficiency and productivity, it is preferable that lamination thicknesses of A layer and C layer be set equal.

The biaxially oriented polyester film for molded part of the present invention needs interlayer adhesion between A layer and B layer of 5 N/15 mm or more to prevent delamination between layers after forming. When the interlayer adhesion between A layer and B layer is less than 5 N/15 mm, there is a case that delamination occurs at the interface of A layer/B layer after processing a polyester film or a molded part with a polyester film. The interlayer adhesion is further preferably 8 N/15 mm or more, and most preferably 12 N/15 mm or more.

Further, to prevent delamination after forming, in the biaxially oriented polyester film for molded part of the present invention, interlayer adhesion between A layer and B layer after being stretched at 200° C. by 1.2 times in the longitudinal direction and transverse direction of a film is preferably 3 N/15 mm or more. When the interlayer adhesion between A layer and B layer after being stretched at 200° C. by 1.2 times in the longitudinal direction and transverse direction of a film is less than 3 N/15 mm, there is a case that delamination occurs at the interface of A layer/B layer after severely processing a polyester film or a molded part with a polyester film. The interlayer adhesion between A layer and B layer after being stretched at 200° C. by 1.2 times in the longitudinal direction and transverse direction of a film is further preferably 5 N/15 mm or more, and most preferably 7 N/15 mm or more.

Although a method for stretching a film at 200° C. by 1.2 times in the longitudinal direction and transverse direction of a film is not particularly limited, for example, stretching can be done with a film stretcher.

Interlayer adhesion herein means the value (delamination strength) that delamination is forcefully generated at the interface of A layer/B layer, thereafter, a load in delamination in a tensile test is measured. Specifically, an adhesive with a higher strength than adhesion of the interface of A layer/B layer is coated on a film sample, and then a film for gluing is glued thereon. Although the film for gluing used here is not particularly limited, polyester film, polypropylene film, polyethylene film and the like are listed. The sample glued is cut to 15 mm width, when a 180° peel test is done at a speed of 300 mm/min, the peel strength is defined as interlayer adhesion between A layer and B layer (N/15 mm).

In the present invention, the longitudinal direction of a film is referred to as MD, and the transverse direction of a film is referred to as TD.

For the interlayer adhesion between A layer and B layer is to set to the above-described range, it is effective that polyester A and polyester B have almost the same composition. For example, from the point of formability, given that composition of polyester B consists of a copolymerized polyethylene terephthalate of polyethylene terephthalate, polybutylene terephthalate and 1,4-cyclohexanedimethanol, when composition of polyester A is a copolymerized polyethylene terephthalate of polyethylene terephthalate, polybutylene terephthalate and/or 1,4-cyclohexanedimethanol, interlayer adhesion will become high. Further, by setting polyester A and polyester B to the same composition, a very high interlayer adhesion can be achieved, which is particularly preferred.

Upon heat treatment in production of film, it is effective to improve adhesion through disturbing the interface between A layer and B layer by melting a part of polyester A or polyester B. For example, a polyester resin with a melting point of about 220° C. to 230° C. such as polybutylene terephthalate and polytrimethylene terephthalate is included in polyester A or polyester B, and heat treatment temperature is set at 220° C. or more, the above-described polyester is melted and interface is disturbed, thereby to improve interlayer adhesion.

From the above reasons, in the biaxially oriented polyester film for molded part of the present invention, it is preferable that a small endotherm peak (Tmeta) before crystal melting, measured by a differential scanning calorimeter, be 220 to 255° C. Herein, Tmeta is a temperature of an endotherm peak present before crystal melting and being derived from heat treatment temperature in an endotherm melting curve detected during a primary rising temperature (1st run) of differential scanning calorimetric analysis measuring method. When Tmeta is 220 to 255° C., namely, when heat treatment temperature is 220 to 255° C., a part of polyester A or polyester B is melted, interface is disturbed thereby to improve interlayer adhesion. Tmeta is preferably 220 to 250° C., further preferably 220 to 245° C. It is further preferably 221 to 244° C., and most preferably 222 to 243° C.

In the biaxially oriented polyester film for molded part of the present invention, from the viewpoint of secondary workability such as thermoforming, stress at 100% elongation at 200° C. and 150° C. in the longitudinal direction and transverse direction of a film needs 1 to 50 MPa. In processing using a formable decorative sheet, since a suitable forming temperature of molded part differs depending on a resin of substrate of a formable decorative sheet, in the case of using in such manner that the biaxially oriented polyester film for molded part of the present invention is attached on a substrate resin necessary for forming at high temperature, stress at 100% elongation at 200° C. in the longitudinal direction and transverse direction of a film needs 1 to 50 MPa. In the case of using in such manner that the biaxially oriented polyester film for molded part of the present invention is attached on a substrate resin with low heat resistance, since forming temperature becomes as low as about 150° C., stress at 100% elongation at 150° C. in the longitudinal direction and transverse direction of a film needs 1 to 50 MPa. When a F100 value either at 200° C. or 150° C. in the longitudinal direction and transverse direction of a film is less than 1 MPa, there is a case that the film cannot stand against a tension for film transportation in a preheat process in processing, it deforms, and breaks depending on circumstances, so that the commercial value as a molded part is sometimes lost. Reversely when more than 50 MPa, change of shape is insufficient in thermoforming, compliance to a forming metal mold is poor, so it cannot be used as a molded part. Even when the F 100 value satisfies the above-described range only in the longitudinal direction or transverse direction, since balance of formability becomes bad, and usage as a molded part cannot be fulfilled, the F 100 value needs to satisfy the above-described range both in the longitudinal direction and transverse direction. F100 value at 200° C. and 150° C. in the longitudinal direction and transverse direction of a film is preferably 2 to 40 MPa from the points of handleability and formability, and more preferably 2.5 to 35 MPa.

In the biaxially oriented polyester film for molded part of the present invention, from the viewpoint of secondary workability such as thermoforming, tensile elongation at break at 200° C. and 150° C. in the longitudinal direction and transverse direction of a film is preferably 150 to 400%. As described above, since regarding forming temperature of molded part, a suitable forming temperature differs depending on a substrate resin, there is a case of using in such manner that the biaxially oriented polyester film for molded part of the present invention is attached on a substrate resin necessary for forming at high temperature, or a substrate resin with low heat resistance, so tensile elongation at break at 200° C. and 150° C. in the longitudinal direction and transverse direction of a film is preferably 150 to 400%. When tensile elongation at break either at 200° C. or 150° C. in the longitudinal direction and transverse direction of a film is less than 150%, there is a case that a film breaks in thermoforming and change of shape is insufficient. When 400% or more is intended, it is very difficult to satisfy heat resistance, there is a case that a film cannot stand against tension for film transportation in a preheating process in processing and a film deforms, which is not preferable. Even when tensile elongation at break satisfies the above-described range either in the longitudinal direction or transverse direction, since balance of formability becomes bad, and usage as a molded part cannot be fulfilled, so tensile elongation at break preferably satisfies the above-described range both in the longitudinal direction and transverse direction. Tensile elongation at break at 200° C. and 150° C. in the longitudinal direction and transverse direction of a film is preferably 160 to 380% from the points of handleability and formability, and most preferably 170 to 360%.

Herein, F100 value at 200° C. and 150° C. is a stress at 100% elongation when a film sample cut to a rectangular shape of 50 mm in test length is preheated in a constant-temperature bath set at 200° C. or 150° C., and a tensile test is carried out at a strain speed of 300 mm/min. Tensile elongation at break at 200° C. and 150° C. is an elongation at break of film when a tensile test is carried out in the condition as the above.

In the biaxially oriented polyester film for molded part of the present invention, for the F100 value and tensile elongation at break at 200° C. in the longitudinal direction and transverse direction of a film to satisfy the above-described ranges, it is preferable that a film be stretched by 2.5 to 3.5 times at 90 to 130° C. each in the longitudinal direction and transverse direction of a film, and area ratio (stretching ratio in longitudinal direction x stretching ratio in transverse direction) is preferably 7 to 11 times. In heat setting process after stretching, making a heat treatment temperature high is preferable because orientation in the amorphous part of film can be relaxed. The heat treatment temperature is preferably 200 to 255° C., and further preferably 220 to 255° C.

For the tensile elongation at break to be the above-described range, it is necessary to reduce drawbacks of film as possible during and after film production. To eliminate drawbacks, dust-proof facilities in film-making atmosphere and keeping good condition of extruder, stretching roll and winding roll and the like become important.

Preventing deterioration of polymer in extrusion is also important. To prevent deterioration of polymer in extrusion, it is necessary to control extrusion temperature and residence time of polymer properly, and carry out nitrogen purge in an extruder and water removal of polymer and the like. A preferable extrusion temperature is a melting point of polymer +10 to 40° C. A suitable residence time of polymer varies depending on polymer, and it is preferably shorten to a degree not generating an unmelted part.

In the biaxially oriented polyester film for molded part of the present invention, lamination thickness of A layer is preferably 0.5 to 12 μm. When the lamination thickness is less than 0.5 μm, since A layer tends to break, and trigger of delamination at the interface of A layer and B layer easily takes place, which is not preferable because there is a case that interface delamination after forming is generated. Reversely when the lamination thickness is thickened in more than 12 μm, when particle concentration is heightened for providing handleability to the A layer side, it is not preferable because there is a case that transparency deteriorates. The lamination thickness is further preferably 0.7 to 11 μm, and most preferably 1 to 10 μm. In the case of using in an application that transparency is not necessary, by setting a lamination thickness in 2.5 to 12 μm, even when forming ratio becomes high in deep drawing or the like, it is preferable because there is no trigger of interface delamination.

Further, in the biaxially oriented polyester film for molded part of the present invention, lamination ratio (A layer)/(whole film) is preferably 0.001 to 0.5. Given that lamination ratio is less than 0.001, when lamination thickness is set to 0.5 μm or more, a film thickness needs to be at least 500 μm or more, even by reducing strain stress in thermoforming, a load actually loaded becomes large, so it is not preferable because there are cases that uneven deformation occurs and productivity is lowered due to long time in raising temperature for processing. Reversely when lamination ratio is 0.5 or more, the effect of A layer becomes large, when particle concentration is heightened for providing handleability to the A layer side, it is not preferable because there is a case that transparency deteriorates. The lamination ratio (A layer)/(whole film) is further preferably 0.01 to 0.5, particularly preferably 0.015 to 0.45, and most particularly preferably 0.02 to 0.4. In the case of a three-layer constitution of A layer/B layer/A layer, it represents a lamination ratio of one layer at one side of A layer relative to the whole film.

In the case of a there-layer constitution of A layer/B layer/C layer, lamination thickness of C layer is preferably 0.5 to 12 μm similar to A layer, and lamination ratio (C layer)/(whole film) is preferably 0.001 to 0.5. The above-described lamination thickness and lamination thickness ratio can be achieved by adjusting discharge rate in extrusion of polyester introducing from A layer to C layer. The discharge rate can be appropriately adjusted by the screw rotation number of an extruder, rotation number of gear pump when a gear pump is used, extrusion temperature, viscosity of polyester raw material and the like.

Regarding the lamination thickness and lamination thickness ratio, lamination thickness of each layer and lamination ratio can be obtained by observing a cross section of film at 500 to 10000 magnifications by a scanning electron microscope, transmission electron microscope, an optical microscope or the like.

In the biaxially oriented polyester film for molded part of the present invention, from the points of appearance and luster as a molded part, haze of film is preferably 0.01 to 0.2%/μm. When haze is more than 0.2%/μm, appearance of film looks clouded, appearance and decorative effect are sometimes inferior. On the other hand, when haze is less than 0.01%/μm, lubrication of film is bad, handling becomes difficult, scar occurs on a film surface, wrinkle tends to occur in winding film into a roll shape, which not only gives an adverse influence to appearance as a molded part, but also worsens handling of film itself. A more preferable range of haze from appearance as a molded part is 0.04 to 0.15%/μm, and 0.08 to 0.13%/μm is particularly preferable.

As a method for haze to be 0.01 to 0.2%/μm, it is a preferable method that lubricant particles are added only to A layer and B layer, and optical characteristics are controlled while maintaining handleability of film. In the case of a three-layer constitution of A layer/B layer/C layer, adding particles only to A layer and C layer is preferable. In particular, when layer thickness of A layer is denoted as $t_A$ (unit: μm), particles that a circle-equivalent diameter P of a particle to be added to A layer (unit: μm) satisfies a relationship of $0.5 \leq P/t_A \leq 2$ are preferably added to A layer by 0.005 to 0.06% by mass, further preferably 0.005 to 0.03% by mass. Although the lubricant particle used here is not particularly limited, using additional particles rather than internal particles is preferable. As the additional particles, for example, there can be used wet type or dry type silica, colloidal silica, aluminum silicate, titanium dioxide, calcium carbonate, calcium phosphate, barium sulfate and aluminum oxide; and as organic particles, particles having constitutional components such as styrene, silicone, acrylic acids, metharylic acids, polyesters and divinyl compounds. Among them, it is preferable to use inorganic particles such as wet type or dry type silica and alumina, and particles having constitutional components such as styrene, silicone, acrylic acids, metharylic acids, polyesters and divinylbenzene. Further, these additional particles may be in concomitant use of two kinds or more.

In the biaxially oriented polyester film for molded part of the present invention, a heat-shrinkable stress at 200° C. in the longitudinal direction and transverse direction is preferably 0 to 0.16 MPa. When the heat-shrinkable stress is more than 0.16 MPa, since shrinkage tends to occur in a preheating process in thermoforming, for example, when used by attaching only A layer and B layer with a formable sheet, it is not preferable because slippage between layers occurs due to heat shrinkage and delamination sometimes occurs. The heat-shrinkable stress at 200° C. in the longitudinal direction and transverse direction is more preferably 0 to 0.14 MPa, and most preferably 0 to 0.12 MPa.

For a heat-shrinkable stress at 200° C. in the longitudinal direction of a polyester film to be the above-described range, it is preferable that a stretching ratio in the longitudinal direction of a film be less than 3.5 times. For a heat-shrinkable stress in the transverse direction to be the above-described range, it is preferable that a stretching ratio in the transverse direction is less than 3.5 times. Further, in the case of using a tenter-type stretching machine, a heat-shrinkable stress can be reduced resulting from relaxation in strain of film by relaxing after stretching. A preferable relaxing rate is 1.5 to 10%, being 1.7 to 7% is more preferable, and being 2 to 5% is most preferable. Further, a heat-shrinkable stress can be reduced by increasing a heat treatment temperature, because orientation-relaxation of the amorphous part of film takes place. The heat treatment temperature is preferably 200 to 255° C., and further preferably 220 to 255° C.

Next, a specific production method of the biaxially oriented polyester film for molded part of the present invention will be described, but it is not limited thereto. First, as a polyester resin used in the film of the present invention, although a commercially available polyethylene terephthalate resin or polybutylene terephthalate resin is purchased and used as it is, for example, in the case of a polyethylene terephthalate resin, it can be polymerized as follows.

To a mixture of 100 parts by mass of dimethyl terephthalate and 70 parts by mass of ethylene glycol, 0.09 parts by mass of magnesium acetate and 0.03 parts by mass of antimony trioxide are added, temperature is gradually raised, an ester exchange reaction was carried out finally at 220° C. while distilling out methanol. Subsequently, to the ester exchange reaction product, 0.020 parts by mass of 85% phosphoric acid aqueous solution is added, then, transferred to a polycondensation reaction tank. While raising temperature by heating in the polymerization tank, pressure of a reaction system is gradually reduced, polycondensation reaction is carried out at 290° C. under a reduced pressure of 1 hPa, to obtain a polyethylene terephthalate resin with a desired intrinsic viscosity. When particles are added, it is preferable to add a slurry that particles are dispersed in ethylene glycol into the polymerization tank for the particle concentration so as to be a predetermined one, and to polymerize.

A production of polybutylene terephthalate resin can be carried out as follows, for example. A mixture of 100 parts by mass of terephthalic acid and 110 parts by mass of 1,4-butanediol is heated up to 140° C. under nitrogen atmosphere to produce a homogeneous solution, then, 0.054 parts by mass of tetra-n-butyl orthotitanate and 0.054 parts by mass of monohydroxybutyltin oxide are added to carry out esterification reaction. Subsequently, 0.066 parts by mass of tetra-n-butyl orthotitanate is added to carry out polycondensation reaction under a reduced pressure, thereby to obtain a polybutylene terephthalate resin with a desired intrinsic viscosity.

A preferable method for producing a film of the present invention using the thus obtained polyester resin is specifically described. First, given that polyester resins to be used are polyester A and polyester B, when being mixed, they are each weighed in a predetermined ratio and mixed. Subsequently, each is dried under nitrogen atmosphere or vacuum atmosphere, for example, at 180° C. for 4 hours, water content in polyester is preferably reduced to 50 ppm or less. Then, polyester A and polyester B are supplied to a separate extruder and melt extruded. Additionally, in the case of using a vent type biaxial extruder for melt extrusion, a drying process of resin may be omitted. Subsequently, through a filter and a gear pump, foreign materials are removed and each throughput rate is homogenized, for example, each resin is laminated so that a A/B type two-layer film is produced through a feed block disposed above a T-die and a multi-manifold, thereafter discharged in a sheet onto a cooling drum from the T-die. In the case of producing a film of a A/B/C type three-layer lamination, polyester A, polyester B and polyester C are supplied to a separate extruder and melt extruded. When polyester A and polyester C are the same composition, by two extruders, a film of a A layer/B layer/A layer type three-layer lamination can be produced through a feed block and a multi-manifold. In discharging in a sheet onto a cooling drum, for example, by an electrostatic method using a wire like electrode or a tape like electrode, a casting method providing water membrane between a casting drum and an extruded polymer sheet, a method in which an extruded polymer is attached to the drum by setting a casting drum temperature at a glass transition temperature of polyester resin to (glass transition temperature −20° C.), or a method in which a plurality of these methods is combined, a sheet like polymer is closely attached onto a casting drum to cool and solidify it thereby to obtain an unstretched film. Among these casting methods, when polyester is used, an electrostatic method is preferably used from the points of productivity and flatness.

Next, stretching is conducted by a successive biaxial stretching where after the unstretched film is stretched in the longitudinal direction, it is stretched in the transverse direction, or after stretching in the transverse direction, it is stretched in the longitudinal direction; or by a simultaneous biaxial stretching where stretching is almost simultaneously done in the longitudinal and transverse directions of a film.

A stretching ratio in such stretching method is, in each direction, preferably 2.5 to 3.5 times, further preferably 2.8 to 3.5 times, and particularly preferably 3 to 3.4 times. Stretching speed is desirably 1,000 to 200,000%/min. Stretching temperature is preferably 90 to 130° C., more preferably, stretching temperature in the longitudinal direction is 100 to 120° C., and stretching temperature in the transverse direction is 90 to 110° C. Stretching may be plurally conducted in each direction.

Further, heat treatment of film is conducted after biaxial stretching. The heat treatment can be conducted by an arbitrary method conventionally known in an oven, on a heated roll or the like. This heat treatment is conducted at a temperature of 120° C. or more and to a melting point of polyester or less, but the heat treatment is preferably 210 to 255° C. From the points of transparency and dimensional stability, being 210 to 250° C. is more preferable. The heat treatment time may be arbitrary in a range not deteriorating characteristics, it is preferably done in 1 to 60 seconds, more preferably 1 to 30 seconds. Further, heat treatment may be done while relaxing a film in the longitudinal direction and/or in the transverse direction. Further, to improve adhesion to an ink printing layer, an adhesive agent and a deposition layer, it is possible to conduct a corona treatment on at least one surface and provide a coating layer.

As a method for providing a coating layer in a film production process, it is preferably a method in which a liquid that the composition of coating layer is dispersed in water is uniformly coated on a film at least uniaxially stretched by using a metering bar or gravure roll, and the coating liquid is dried while stretching, in this case, a thickness of the coating layer is preferably 0.01 to 0.5 μm.

The biaxially oriented polyester film for molded part of the present invention is preferably used in such manner that a metal compound is deposited on at least one surface thereof. By using a film after depositing a metal compound thereon, appearance becomes metallic, it can be preferably used as a replacement for a molded component that a plated resin is used at present. The metal used is not particularly limited, there are listed single elements such as indium (melting point: 156° C.), tin (melting point: 228° C.), aluminum (melting point: 660° C.), silver (melting point: 961° C.), copper (melting point: 1083° C.), zinc (melting point: 420° C.), nickel (melting point: 1453° C.), chromium (melting point: 1857° C.), titanium (melting point: 1725° C.), platinum (melting point: 1772° C.) and palladium (melting point: 1552° C.), or their alloys, and it is preferable to use a metal with a melting point of 150 to 400° C. By using a metal with such melting point range, a metal-deposited layer can be processed in a formable temperature region of polyester film, which is preferable because generation of drawbacks of deposition layer due to forming is easily suppressed. A particularly preferable melting point of a metal compound is 150 to 300° C. A metal compound with a melting point of 150 to 400° C. is not particularly limited, indium (157° C.) and tin (232° C.) are preferable, and in particular, indium can be preferably used from the points of metallic luster and color tone.

As a method for producing a deposition thin film, vacuum deposition, electron-beam deposition, sputtering, ion plating and the like can be used. To improve adhesion between a polyester film and a deposition layer, it may be good to carry out a pretreatment of film surface by corona treatment and a method of coating an anchor coating agent and the like beforehand. Thickness of a deposition film is preferably 1 to 500 nm, and more preferably 3 to 300 nm. From the point of productivity, being 3 to 200 nm is preferable.

Regarding the biaxially oriented polyester film for molded part of the present invention, from the viewpoint of quality maintenance for use in an outdoor condition, it is preferable to provide a weather resistant coating layer on at least one surface thereof. The method for providing a coating layer may use not only the foregoing inline coating in a film production process, but also offline coating, when a thickness of coating layer needs 1 μm or more, conducting offline coating is rather preferable from a production point of view. Although the coating agent used in a weather resistant coating layer is not particularly limited, a composition that water can be used as a solvent used for coating is preferable.

The biaxially oriented polyester film for molded part of the present invention is preferably used as being laminated on a formable decorative sheet. This is preferable because after being laminated on a formable decorative sheet, these are formed as integration, thereby to suppress the scar of surface after forming a decorative sheet and the lowering of gloss.

The constitution of a formable decorative sheet is not particularly limited, but it is preferably a constitution where a decorative layer is laminated on a substrate sheet. It is a preferable mode to laminate a clear layer for giving weather resistance and scar resistance. A structure that a clear layer is directly laminated on a substrate sheet is also preferable constitution because a sufficient value is generated as a decorative sheet.

The substrate of a formable decorative sheet is not particularly limited, a resin sheet, metal plate, paper, wood and the like are listed. Among them, a resin sheet is preferably used from the point of formability, and a thermoplastic resin sheet is preferably used from the point of high formability.

Herein, a thermoplastic resin sheet is not particularly limited as long as it is a thermoformable polymer sheet, there are preferably used an acryl type sheet, ABS (Acrylnitrile-butadiene-styrene) sheet, polystyrene sheet, AS (Acrylnitrile-styrene) sheet, TPO (Thermo Plastic Olefin elastomer) sheet, TPU (Thermo Plastic Urethane elastomer) sheet and the like. The thickness of the sheet is 50 μm to 2000 μm, more preferably 100 μm to 1500 μm, and further preferably 150 μm to 1000 μm.

The resin used as a clear layer is not particularly limited as long as it is a highly transparent resin, there are preferably used a polyester type resin, polyolefin type resin, acryl type resin, urethane type resin, fluorine type resin and the like. Among them, it is preferable to contain a fluorine type resin from the point of weather resistance. A mixture of these resins may be used. For example, a poly(vinylidene fluoride) dispersion liquid dispersed in poly(methyl methacrylate) is preferably used. The lamination thickness of the clear layer is preferably 10 to 100 μm from the viewpoints of weather resistance and handleability, further preferably 15 to 80 μm, and most preferably 20 to 60 μm.

A decorative layer used in a formable decorative sheet is a layer that provides decorations such as coloring, concavity and convexity, pattern, wood-grain, metallic and pearl tone. It decorates a molded article when a formable decorative sheet is used and a molded article is finally produced. A printing material, a layer that a coloring agent is compounded and a metal deposition layer are listed, but it is not limited thereto.

A method for forming a decorative layer is not particularly limited, for example, it can be formed by printing, coating, transfer printing, metal deposition and the like. As a most preferable method for forming a decorative layer, there is listed a method where one that a coloring agent is dispersed in a resin is coated on a carrier film or the like, which is transferred onto a substrate. As a resin used in this case, there are listed a polyester type resin, polyolefin type resin, acryl type resin, urethane type resin, fluorine type resin and the like. A coloring agent used is not particularly limited, taking dispersibility or the like into accounts, it is appropriately chosen from dye, inorganic pigment, organic pigment, and the like. As a dispersion resin, being similar to a clear layer, for example, a poly(vinylidene fluoride) dispersion liquid dispersed in poly(methyl methacrylate) is preferably used.

In the case of metal deposition, a method for producing a deposition thin film is not particularly limited, vacuum deposition, electron-beam deposition, sputtering, ion plating and the like can be used. To improve adhesion between a polyester film and a deposition layer, it is desirable to carry out a pretreatment of deposition surface by corona treatment, a method of coating an anchor coating agent and the like beforehand. As a metal to be used, from the point of formation compliance, it is preferably to use one obtained by depositing a metal compound with a melting point of 150 to 400° C. By using a metal with such melting point range, a metal-deposited layer can be processed in a formable temperature region of polyester film, which is preferable because generation of drawbacks of deposition layer due to forming is easily suppressed. A more preferable melting point of a metal compound is 150 to 300° C. A metal compound with a melting point of 150 to 400° C. is not particularly limited, indium (157° C.) and tin (232° C.) are preferable, and in particular, indium can be preferably used. The lamination thickness of the decorative layer is preferably 0.001 to 100 μm, further preferably 0.01 to 80 μm, and most preferably 0.02 to 60 μm.

A method for providing a clear layer is not particularly limited, but a method of transfer onto a thermoplastic resin sheet (substrate) by using a carrier film is preferable. After a clear layer resin is laminated on a carrier film and dried, it can be transferred onto a thermoplastic resin sheet (substrate). Further, in the case of providing a decorative layer, after a decorative layer is laminated on a clear layer, the decorative layer/clear layer can be transferred onto a thermoplastic resin sheet (substrate). The carrier film used here is not particularly limited, and in laminating a clear layer or clear layer/decorative layer, heating of about 100 to 200° C. is sometimes applied for drying, so a film with good heat-resistance is preferable. From the viewpoints of heat resistance and economic efficiency, there are preferably used polyester films such as polyethylene terephthalate film and polyethylene naphthalate film, or copolyester films containing copolymer components therein.

To enhance adhesion to a thermoplastic resin sheet (substrate), it is preferable to provide a clear layer or an adhesion layer on a decorative layer. The adhesion layer is not particularly limited, and one that a crosslinking agent is added to a urethane type, acryl type, or polypropylene chloride type resin is preferably used. As the crosslinking agent, an epoxy type is preferably used from the point of adhesion. Further, to increase adhesion between the clear layer or decorative layer and the adhesion layer, it is preferable to provide a primer layer of acryl type resin or the like.

The biaxially oriented polyester film for molded part of the present invention is preferably used as being laminated on the surface of a decorative sheet as described above, and a method that the film of the present invention is used as a carrier film, i.e., after "clear layer" or "decorative layer/clear layer" is laminated on a thermoplastic resin sheet (substrate), being held in a laminated state on the clear layer as it is, used as a protection film in forming a formable decorative sheet as it is (carrier film itself becomes protection film), is very preferable because of large economic effect due to simplification of production processes of molded articles.

With the constitution described above, a method for producing a formable laminate that the biaxially oriented polyester film for molded part of the present invention is laminated on a formable decorative sheet is specifically described. The present invention is not limited thereto.

A formable laminate that the biaxially oriented polyester film for molded part is laminated on a formable decorative sheet is produced as follows: a poly(vinylidene fluoride) dispersion liquid dispersed in poly(methyl methacrylate) is die-coated on a polyethylene terephthalate carrier film by die-coat to laminate a clear layer and dry. Further, one that a coloring agent is dispersed in a poly(vinylidene fluoride) dispersion liquid dispersed in poly(methyl methacrylate) is laminated thereon by die-coat method and dried, thereby to produce a constitutional body of carrier film/clear layer/decorative layer. On the decorative layer of the constitutional body, an acryl type polymer is laminated as a primer layer, further, urethane resin/epoxy type crosslinking agent is laminated as a adhesion layer. The constitutional body of carrier film/clear layer/decorative layer/primer layer/adhesion layer obtained by such method is bonded via the adhesion layer on a TPO sheet that corona treatment was conducted on the surface. Thereafter, by peeling the carrier film, it became a formable decorative sheet whose constitution is TPO sheet/adhesion layer/decorative layer/clear layer. Further, the biaxially oriented polyester film for molded part of the present invention is pressure-bonded and laminated on this formable decorative sheet.

Next, a forming method of this formable laminate is specifically explained, but the forming method is not limited thereto.

A formable laminate is heated for its surface temperature to be 30 to 200° C. by using a far-infrared heater of 150 to 400° C., and formed into a desired shape by pushing a metal mold and vacuuming. In the case of forming at a severe ratio, a deeper forming becomes possible by a higher pneumatic forming of a sheet. The thus molded formable laminate undergoes trimming and becomes a molded article that the biaxially oriented polyester film for molded part of the present invention is laminated as a protection film. Although this molded article may be used as it is, in order to provide strength as a molded article, TPO, polycarbonate, ABS resin or the like is injected to a concave part by pushing the metal mold. In this way, a molded part is completed by peeling the biaxially oriented polyester film for molded part from the molded article formed.

Regarding the thus obtained molded part, the gloss is high, drawbacks such as scar, strain and undulation are hardly observed, exhibiting a very good appearance, thus, it is preferably used as building materials, automobile components and parts of such as cellular phone and electric appliance.

As described above, in the resulting molded part, an absolute value of difference in gloss of the resulting molded part from a formable decorative sheet before forming can be less than 10. When an absolute value of difference in gloss is less than 10, there is no large difference before and after forming in a gloss evaluation by naked eye, which is preferable because gloss impression designed before forming can be held. The absolute value of difference in gloss from a formable decorative sheet before forming is more preferably less than 5, and most preferably less than 3.

Regarding the biaxially oriented polyester film for molded part of the present invention, in order to provide peel property after forming, a surface free energy of a film surface may be controlled. Setting the surface free energy of a film surface to 15 to 47 mN/m is preferable because peel property after forming becomes good. When the surface free energy is less than 15 mN, it is not preferable because there is a case that in laminating a formable decorative sheet, adhesion becomes insufficient and compliance is lost in forming. When the surface free energy of a film surface is more than 47 mN/m, it is not preferable because peel property is sometimes lowered after forming. As a method for the surface free energy of a film surface to be the above-described range, there are listed a method that a demolding layer containing a water-repellant compound such as silicone type compound, fluorine type compound and wax compound is laminated on a film surface, and these compounds are kneaded in a polyester resin.

The biaxially oriented polyester film for molded part of the present invention may be used again through collection after being peeled from a molded article. Further, the collected film is melted to produce pellets again for a recycled raw material, being used as a raw material for production of film, this is very good economically and environmentally.

The biaxially oriented polyester film for molded part of the present invention has excellent processability, and can easily produce a molded component in compliance with a metal mold in thermoforming such as vacuum and pneumatic forming. Hence, by previously depositing metal before forming, it can be suitably used as molded component with a plated appearance for automobile members and parts of electric appliance, further, it is also used as a surface protection film in forming a decorative sheet, which makes the appearance of a molded component beautiful, thus, a completed molded article is preferably used as building materials, automobile components and parts of cellular phone and electric appliances, and the like.

EXAMPLES

Hereinafter, the present invention will be explained in detail by Examples. Characteristics were measured and evaluated by the following methods.

(1) Melting Point, Glass Transition Temperature

These were measured using a differential scanning calorimeter (RDC220, manufactured by Seiko, Ltd.). Using polyester of 5 mg that polyester A, polyester B or polyester C alone was melt-extruded after vacuum drying as a sample, an endotherm peak in raising temperature from 25° C. to 300° C. at 20° C./min was defined as a melting point. In a case where a plurality of endotherm peaks was present, an endotherm peak at the highest temperature side was defined as a melting point. The change of specific heat based on transition from a glass state to a rubber state was read, and this temperature was defined as a glass transition temperature.

(2) Small Endotherm Peak Before Crystal Melting (Tmeta)

A polyester film (5 mg) was measured in the same equipment and the same condition as (1), a small endotherm peak appearing before a melting point was read.

(3) Haze

Film haze was measured on the basis of JIS K 7105 (1985) with a haze meter (HGM-2GP, manufactured by Suga Test Instruments Co., Ltd.). The measurement was conducted at three arbitrary points, and the average thereof was adopted. Film thicknesses were measured at five arbitrary points of film with a dial gauge, and the average was adopted as a film thickness. A value that the film haze measured was divided by the film thickness was defined as haze.

(4) Lamination Thickness

A film was embedded in an epoxy resin, and a film cross section was cut out by a microtome. The cross section was observed at magnifications of 5000 with a transmission electron microscope (TME H7100, manufactured by Hitachi, Ltd), and a lamination thickness ratio of each layer was obtained. The thickness of each layer was calculated from the lamination ratio obtained and the foregoing film thickness. The lamination ratio was calculated as (A)/(whole film).

(5) Composition of Polyester

A resin or film is dissolved in hexafluoroisopropanol (HFIP) or a mixed solvent of HFIP and chloroform, using $^1$H-NMR and $^{13}$C-NMR, the contents of each monomer residue and diethylene glycol generated as a by-product can be quantitatively determined. In the case of a laminated film, each layer of a film is shaved out depending on a lamination thickness, thereby to sample a component constituting each layer element, by which evaluations can be done. As for the laminated film of the present invention, the composition was calculated mathematically from a mixing ratio in production of film.

(6) Interlayer Adhesion

Corona treatment was done on a film surface (A layer side), an adhesive that an adhesive AD503, a hardening agent CAT10 manufactured by Toyo Morton Ltd. and ethyl acetate were mixed by 20:1:20 was coated for a coat thickness to be 3.5 g/m$^2$. After the film coated with the adhesive was held in a hot air oven at 80° C. for 1 minute, it was bonded with a sealant film (manufactured by Toray Advanced Film Co., Ltd.; unstretched polypropylene film, Torafan NO ZK93FM, thickness: 50 μm) with a nip roll (nip condition: 80° C., 0.3 MPa, 10 m/min). Thereafter, it was cured at 40° C., 65 RH % for 72 hours to obtain a bonded film. The bonded film was sampled to a size of 150 mm×15 mm, a 180° peel test was conducted using a tensile test machine (Tensilon UCT-100 manufactured by Orientec Co., Ltd.) at an initial distance between tensile working holding devices of 100 mm, and tensile speed of 50 mm/min. The average of loads at elongation of 50% to 100% was defined as interlayer adhesion.

In regard to interlayer adhesion after forming (interlayer adhesion between A layer and B layer after being stretched at 200° C. by 1.2 times in the longitudinal direction and transverse direction of a film), a sample, which was formed in such manner that a film cut to a size of 90×90 mm in the longitudinal direction and transverse direction was set to a film stretcher heated at 200° C. (manufactured by Toyo Seiki Seisaku-Sho, Ltd.), preheated for 30 seconds, then, simultaneous biaxial stretching was conducted in the longitudinal direction and transverse direction simultaneously by 1.2 times at a speed at 3000%/min, was subjected to measurement in the same manner as described above.

(7) Stress at 100% Elongation, Tensile Elongation at Break

A sample was prepared by cutting a film to a rectangle of 150 mm in length×10 mm in width in the longitudinal direction and transverse direction. A tensile test was conducted each in the longitudinal direction and transverse direction of a film with a tensile test machine (Tensilon UCT-100 manufactured by Orientec Co., Ltd.) at an initial distance between tensile working holding devices of 50 mm and tensile speed of 300 mm/min. The measurement was conducted in such manner that a film sample was placed in a constant-temperature bath previously set at 200° C., after preheat for 60 seconds, a tensile test was done. The load loaded on a film when a sample was elongated to 100% was read, a value that the measurement was divided by the cross section area of a sample before the test (film thickness×10 mm) was denoted as a stress at 100% elongation (F100 value). The elongation when a film broke was denoted as a tensile elongation at break. The measurement was conducted five times for each sample in each direction, and evaluation was done by the average.

(8) Heat-Shrinkable Stress

A sample was prepared by cutting a film to a rectangle of 50 mm in length×4 mm in width in the longitudinal direction and transverse direction. Using a thermo mechanical analyzer (TMA EXSTAR6000, manufactured by Seiko Instrument, Inc.), temperature was raised from 25° C. to 210° C. at 10°

C./min in a sample length of 15 mm held constant, a stress due to heat shrinkage at this time was measured, and a stress at 200° C. was read.

(9) Delamination Test After Forming

On an ABS sheet (200 mm×300 mm) stored in a hot air oven at 200° C. for 2 minutes, a biaxially oriented polyester film for molded part was laminated (180° C., 1 m/min, 0.3 MPa) via an adhesion sheet, then, the bonded sheet was cut with an electric saw. By using burr generated at the cut edge part as a trigger, A layer part was forcibly delaminated by hand from the lamination interface (A layer/B layer part) of the biaxially oriented polyester film for molded part, and the result was evaluated by the following criteria. The adhesion sheet was produced by melt-pressing Polyester SP170 (manufactured by Nippon Synthetic Chemical Industry Co., Ltd.) (120° C., 4MPa, 1 min.).

Excellent: No delamination occurred.

Good: Although delamination occurred near burr, film breakage took place and no further delamination occurred.

Bad: delamination occurred without resistance.

(10) Appearance After Metal Deposition

On one surface of a film, plasma treatment (target: NiCr, electric source: DC pulse, electric power: 5.5 kW, gas: $N_2$ (200 sccm), treatment speed: 1 m/min.) was done, and continuously sputter treatment was done using indium as a target, thereby to form an indium layer. The indium-deposited film was cut to a size of 200×300 mm, and ten pieces were laid side-by-side, which were observed from a nonmetal layer side and evaluation was done by the following criteria.

Excellent: It was a uniform metallic film.

Good: Although there was somewhat whitish cloudiness, it was excellent metallic.

Bad: There was cloudiness and appearance was inferior in metallic luster.

(11) Characteristic as Protection Film

A poly(vinylidene fluoride) dispersion liquid dispersed in poly(methyl methacrylate) by 10% by mass is die-coated on a polyethylene terephthalate carrier film by die-coat to laminate a clear layer and dried at 200° C. for 10 seconds. Further, on the clear layer, an acryl type polymer (68070, manufactured by DuPont Corporation) dispersed in toluene by 30% by mass as a primer layer was coated by a gravure coater, further, as a adhesion layer, an adhesive that an adhesive AD503, a hardening agent CAT10 manufactured by Toyo Morton Ltd. and ethyl acetate were mixed by 20:1:20 (weight ratio) was coated thereto. On the surface of TPO sheet that corona treatment was done, a carrier film obtained by such method was bonded via the adhesion layer, the carrier film was peeled to give a decorative sheet constituted by TPO sheet/adhesion layer/clear layer. Further, this decorative sheet was laminated with the biaxially oriented polyester film for molded part by thermal pressure-bonding (150° C., 0.3 MPa, 10 m/min.), thereby to produce a formable laminate that a biaxially oriented polyester film for molded part was used. The formable laminate was heated for the surface temperature to be 150° C. with a far-infrared heater of 400° C., and subjected to vacuum forming along a cylindrical meal mold (bottom face diameter of 50 mm) heated at 40° C. Thereafter, the biaxially oriented polyester film for molded part was peeled, thereby a molded part was produced, and the state formed along the metal mold was evaluated as forming degrees (drawing ratio, molded height/bottom face diameter).

Further, in accordance with a method defined in JIS-Z-8741(1997), using a digital angle-variable gloss tester UGV-5D manufactured by Suga Test Instruments Co., Ltd., the surface of a formable decorative sheet before forming and the surface of the molded part after forming were measured for 60° specular gloss, and the deference of gloss before and after forming was evaluated. The measurement of gloss was done by n=5, the average that the maximum and minimum were eliminated was adopted. In this way, from the forming degrees and gloss, characteristic as a protection film was evaluated by the following criteria.

Excellent: It was able to be formed in a drawing ratio of 0.7 or more, and an absolute value of difference in gloss between the molded article obtained and formable decorative sheet before forming was less than 3.

Good: It was able to be formed in a drawing ratio of 0.7 or more, and an absolute value of difference in gloss between the molded article obtained and formable decorative sheet before forming was 3 to 5.

Pass: It was able to be formed in a drawing ratio of 0.3 to 0.7, and an absolute value of difference in gloss between the molded article obtained and formable decorative sheet before forming was less than 10.

Bad: It was not able to be formed into a shape with a drawing ratio of 0.3.

(Production of Polyester)

A polyester resin to be used for producing a film was prepared as follows:

(PET)

To a mixture of 100 parts by mass of dimethyl terephthalate and 70 parts by mass of ethylene glycol, 0.04 parts by mass of manganese acetate was added, temperature was gradually raised, and an ester exchange reaction was carried out finally at 220° C. while distilling out methanol. Subsequently, 0.025 parts by mass of 85% phosphoric acid aqueous solution and 0.02 parts by mass of germanium dioxide were added, a polycondensation reaction was carried out at 290° C. under a reduced pressure of 1 hPa, thereby to obtain a polyethylene terephthalate resin copolymerized with 2 mole % of diethylene glycol generated as a by-product, having an intrinsic viscosity of 0.65.

(PBT)

A mixture of 100 parts by mass of terephthalic acid and 110 parts by mass of 1,4-butanediol was made to a homogeneous solution by raising temperature to 140° C. under nitrogen atmosphere, then, 0.054 parts by mass of tetra-n-butyl orthotitanate and 0.054 parts by mass of mono-hydroxybutyltin oxide were added, and an esterification reaction was carried out. Subsequently, 0.066 parts by mass of tetra-n-butyl orthotitanate was added, a polycondensation reaction was carried out under reduced pressure, thereby to obtain a polybutylene terephthalate resin having an intrinsic viscosity of 0.88. Thereafter, crystallization was conducted at 140° C. under nitrogen atmosphere, then, solid phase polymerization was conducted at 200° C. under nitrogen atmosphere for 6 hours to give a polybutylene terephthalate resin having an intrinsic viscosity of 1.22.

(PTT)

100 parts by mass of dimethyl terephthalate and 80 parts by mass of 1,3-propanediol were subjected to an ester exchange reaction under nitrogen atmosphere by using tetrabutyl titanate as a catalyst in raising temperature gradually from 140° C. to 230° C. while distilling out methanol. Further, a polycondensation reaction was carried out under the condition of a constant temperature of 250° C. for 3 hours, thereby to obtain a polytrimethylene terephthalate resin having an intrinsic viscosity [η] of 0.86.

(PETG)

To a mixture of 100 parts by mass of dimethyl terephthalate, 60 parts by mass of ethylene glycol and 20 parts by mass of 1,4-cyclohexanedimethanol, 0.04 parts by mass of manganese acetate was added, temperature was gradually raised, and an ester exchange reaction was carried out finally at 220° C. while distilling out methanol. Subsequently, 0.045 parts by mass of 85% phosphoric acid aqueous solution and 0.01 parts by mass of germanium dioxide were added, by gradually raising temperature and reducing pressure, finally raising temperature and reducing pressure to 275° C. and 1 hPa, a polycondensation reaction was carried out until intrinsic viscosity was 0.67, thereafter, discharged into strands, cooled and cut, thereby to obtain a polyethylene terephthalate resin copolymerized with 1,4-cyclohexanedimethanol of 8 mole %. The polymer was cut to a cube of 3 mm diameter, using rotary vapor polymerization equipment, solid polymerization was conducted at 225° C. under a reduced pressure of 1 hPa until intrinsic viscosity was 0.8.

(PETI)

To a mixture of 82.5 parts by mass of dimethyl terephthalate, 17.5 parts by mass of dimethyl isophthalate and 70 parts by mass of ethylene glycol, 0.09 parts by mass of magnesium acetate and 0.03 parts by mass of antimony trioxide were added, temperature was gradually raised and finally at 220° C., an ester exchange reaction was carried out while distilling out methanol. Subsequently, 0.020 parts by mass of 85% phosphoric acid aqueous solution was added to the ester exchange reaction product, then, transferred to a polycondensation reaction tank. A pressure of reaction system in the polymerization tank was gradually reduced while raising temperature by heating, and a polycondensation reaction was carried out at 287° C. under a reduced pressure of 1 hPa, thereby to obtain a polyethylene terephthalate resin copolymerized with 17.5 mole % of isophthalic acid copolymerized with 2 mole % of diethylene glycol generated as a by-product, having an intrinsic viscosity of 0.7.

(PETM)

To a mixture of 100 parts by mass of dimethyl terephthalate and 70 parts by mass of ethylene glycol, 0.04 parts by mass of magnesium acetate was added, temperature was gradually raised and finally at 220° C., an ester exchange reaction was carried out while distilling out methanol. Subsequently, 0.025 parts by mass of 85% phosphoric acid aqueous solution and 0.02 parts by mass of germanium dioxide were added thereto. Further, ethylene glycol slurry of wet silica agglomerated particle of 1.2 μm in number average particle diameter was added for the particle concentration to be 2 mass %, and a polycondensation reaction was carried out at 290° C. under a reduced pressure of 1 hPa, to obtain a polyethylene terephthalate particle-master copolymerized with 2 mole % of diethylene glycol generated as a by-product, having an intrinsic viscosity of 0.65.

Example 1

A three layer laminated film of A layer/B layer/A layer was produced. As polyester A composing A layer, it was used by mixing PET, PBT, PETG and PETM by a mass ratio of 34:25:40:1. As polyester B composing B layer, it was used by mixing PET, PBT, PETG and PETM by a mass ratio of 34.8:25:40:0.2.

Each mixed polyester resin was separately dried in a vacuum drier at 180° C. for 4 hours, after water was sufficiently removed, supplied to a separate single screw extruder, and melted at 280° C., passed through a filter and a gear pump via each path way, after removing foreign materials and homogenizing throughput rate, laminated inside a feed block disposed above a T-die so that A layer/B layer/A layer (see lamination thickness ratio in Tables) was formed, then, discharged from the T-die in a sheet onto a cooling drum controlled at a temperature of 25° C. In this case, an electrostatic state was given using a wire like electrode of 0.1 mm diameter to be closely attached on the cooling drum to obtain an unstretched film.

Subsequently, film temperature was raised by a heating roll before stretching in the longitudinal direction, finally at a film temperature of 100° C., film was stretched by 3.1 times in the longitudinal direction, and immediately cooled by a metal roll controlled at a temperature of 40° C. Next, by a tenter type transverse stretching machine, it was stretched by 3.1 times in the transverse direction at a preheating temperature of 70° C. and a stretching temperature of 100° C., and heat treatment was done at 243° C. for 5 seconds in the tenter without modification while being relaxed by 4% in the transverse direction, thereby to obtain a biaxially oriented polyester film of 25 μm in film thickness.

The biaxially oriented polyester film obtained was excellent in formability and interlayer adhesion after forming, further, excellent in appearance after metal deposition by the condition of (10) as well, exhibiting an excellent characteristic as a biaxially oriented polyester film for molded part. The characteristic as a protection film evaluated by the condition of (11) was also good, and a molded article that formability was excellent, the lowering of gloss of a molded article after forming was small and appearance was excellent could be obtained.

Example 2

A three layer laminated film of A layer/B layer/A layer was produced. As polyester A composing A layer, it was used by mixing PET, PETG and PETM by a mass ratio of 33.4:65:1.6. As polyester B composing B layer, it was used by mixing PET, PBT and PETG by a mass ratio of 45:20:35.

A biaxially oriented polyester film of 25 μm in film thickness was obtained in the same manner as in Example 1 except that the heat treatment temperature was set at 240° C.

The biaxially oriented polyester film obtained was excellent in formability and interlayer adhesion after forming, further, excellent in appearance after metal deposition by the condition of (10) as well, exhibiting an excellent characteristic as a biaxially oriented polyester film for molded part. The characteristic as a protection film evaluated by the condition of (11) was also good, and a molded article that formability was excellent, the lowering of gloss of a molded article after forming was small and appearance was excellent could be obtained.

Example 3

A two layer laminated film of A layer/B layer was produced. As polyester A composing A layer, it was used by mixing PET, PETG and PETM by a mass ratio of 37:60:3. As polyester B composing B layer, it was used by mixing PET, PBT and PETG by a mass ratio of 50:15:35.

A biaxially oriented polyester film of 25 μm in film thickness was obtained in the same manner as in Example 1 except that the heat treatment temperature was set at 238° C.

The biaxially oriented polyester film obtained was excellent in formability and interlayer adhesion after forming. However, since haze was somewhat high, some degree of cloudiness was observed in appearance after metal deposition by the condition of (10).

Since F100 at 150° C. was somewhat high, thermoformability as a protection film was somewhat affected to somewhat lower the gloss of a molded article after forming, but a molded article that appearance was an excellent level was able to be obtained.

Example 4

A three layer laminated film of A layer/B layer/A layer was produced. As polyester A composing A layer, it was used by mixing PET, PBT and PETM by a mass ratio of 93.5:5:1.5. As polyester B composing B layer, it was used by mixing PET, PBT and PTT by a mass ratio of 70:15:15.

A biaxially oriented polyester film of 20 μm in film thickness was obtained in the same manner as in Example 1 except that the heat treatment temperature was set at 215° C.

The biaxially oriented polyester film obtained was excellent in formability and appearance after metal deposition by the condition of (10). However, since Tmeta was low, somewhat delamination occurred from the vicinity of burr in a peel test after forming. The characteristic as a protection film evaluated by the condition of (11) was good, and a molded article that formability was excellent, the lowering of gloss of a molded article after forming was small and appearance was excellent could be obtained.

Example 5

A three layer laminated film of A layer/B layer/C layer was produced. As polyester A composing A layer, it was used by mixing PET, PBT, PETG and PETM by a mass ratio of 64:15:20:1. As polyester B composing B layer, it was used by mixing PET and PBT by a mass ratio of 85:15. As polyester C composing C layer, it was used by mixing PET, PTT and PETM by a mass ratio of 94:5:1.

Each mixed polyester resin was separately dried in a vacuum drier at 180° C. for 4 hours, after water was sufficiently removed, supplied to a separate single screw extruder, and melted at 280° C., passed through a filter and a gear pump via each path way, after removing foreign materials and homogenizing throughput rate, laminated inside a feed block disposed above a T-die so that A layer/B layer/C layer (see lamination thickness ratio in Tables) was formed, then, discharged from the T-die in a sheet onto a cooling drum controlled at a temperature of 25° C. In this case, an electrostatic state was given using a wire like electrode of 0.1 mm diameter to be closely attached on the cooling drum to obtain an unstretched film. Additionally, lamination thickness of C layer was set to be the same as A layer.

Subsequently, film temperature was raised by a heating roll before stretching in the longitudinal direction, finally at a film temperature of 95° C., film was stretched by 3.3 times in the longitudinal direction, and immediately cooled by a metal roll controlled at a temperature of 40° C. Next, by a tenter type transverse stretching machine, it was stretched by 3.2 times in the transverse direction at a preheating temperature of 70° C. and a stretching temperature of 100° C., and heat treatment was done at 235° C. for 5 seconds in the tenter without modification while being relaxed by 2% in the transverse direction, thereby to obtain a biaxially oriented polyester film of 20 μm in film thickness.

The biaxially oriented polyester film obtained was excellent in interlayer adhesion after forming and appearance after metal deposition by the condition of (10). However, F100 values at 200° C. and 150° C. were somewhat high and formability was somewhat inferior. Hence, thermoformability as a protection film was also inferior, and the gloss of a molded article after forming was also affected, but a molded article that appearance was a problem-free level could be obtained.

Example 6

A two layer laminated film of A layer/B layer was produced. As polyester A composing A layer, it was used by mixing PET, PETG and PETM by a mass ratio of 45:50:5. As polyester B composing B layer, it was used by mixing PET, PBT and PETI by a mass ratio of 80:15:5.

A biaxially oriented polyester film of 25 μm in film thickness was obtained in the same manner as in Example 1 except that the stretching ratio in the longitudinal direction was 3.3 times and the heat treatment temperature was 237° C.

The biaxially oriented polyester film obtained was excellent in formability and interlayer adhesion after forming. However, since haze was somewhat high, appearance after metal deposition by the condition of (10) became somewhat clouded. Since F100 at 150° C. was somewhat high, thermoformability as a protection film was somewhat affected to somewhat lower the gloss of a molded article after forming, but a molded article that appearance was excellent could be obtained.

Example 7

A three layer laminated film of A layer/B layer/A layer was produced. As polyester A composing A layer, it was used by mixing PET, PETG and PETM by a mass ratio of 58.8:40:1.2. As polyester B composing B layer, it was used by mixing PET and PBT by a mass ratio of 90:10.

A biaxially oriented polyester film of 25 μm in film thickness was obtained in the same manner as in Example 1 except that the stretching temperature was 95° C. and stretching ratio was 3.5 times in the longitudinal direction, the stretching ratio in the transverse direction was 3.2 times, the relaxation in a tenter was 1% and the heat treatment temperature was 228° C.

The biaxially oriented polyester film obtained was excellent in appearance after metal deposition by the condition of (10). However, F100 value was somewhat high, and formability was somewhat inferior, since heat-shrinkable stress at 200° C. was high, interlayer adhesion after forming was somewhat inferior. Thermoformability as a protection film was also inferior, and the gloss of a molded article after forming was also affected, but a molded article that appearance was a problem-free level could be obtained.

Example 8

A three layer laminated film of A layer/B layer/A layer was produced. As polyester A composing A layer, it was used by mixing PET, PBT and PETM by a mass ratio of 68:30:2. As polyester B composing B layer, it was used by mixing PET, PTT and PETG by a mass ratio of 50:20:30.

A biaxially oriented polyester film of 40 μm in film thickness was obtained in the same manner as in Example I except that the heat treatment temperature was set at 240° C.

The biaxially oriented polyester film obtained was excellent in formability and interlayer adhesion after forming. However, since haze was somewhat high, so appearance after metal deposition by the condition of (10) became somewhat clouded. The characteristic as a protection film evaluated by the condition of (11) was also good, and a molded article that formability was excellent, the lowering of gloss of molded article after forming was small and appearance was excellent could be obtained.

Example 9

A three layer laminated film of A layer/B layer/A layer was produced. As polyester A composing A layer, it was used by mixing PET, PETG and PETM by a mass ratio of 78.2:20:1.8. As polyester B composing B layer, it was used by mixing PET, PBT and PETG by a mass ratio of 70:20:10.

A biaxially oriented polyester film of 25 μm in film thickness was obtained in the same manner as in Example 1 except that the heat treatment temperature was set at 218° C.

The biaxially oriented polyester film obtained was excellent in formability and appearance after metal deposition by the condition of (10). However, since Tmeta was low, delamination somewhat easily occurred in a peel test after forming. Since F100 at 150° C. was somewhat high, thermoformability as a protection film was somewhat affected to somewhat lower the gloss of a molded article after forming, but a molded article that appearance was excellent could be obtained.

Example 10

A three layer laminated film of A layer/B layer/A layer was produced. As polyester A composing A layer, it was used by mixing PET, PETG and PETM by a mass ratio of 58.3:40:1.7. As polyester B composing B layer, it was used by mixing PET and PETG by a mass ratio of 40:60.

A biaxially oriented polyester film of 15 μm in film thickness was obtained in the same manner as in Example 1 except that the extrusion temperature was 295° C. and the heat treatment temperature was 235° C.

The biaxially oriented polyester film obtained was excellent in interlayer adhesion after forming and appearance after metal deposition by the condition of (10). However, since the extrusion temperature was high, tensile elongation at break of film was low and formability was somewhat inferior. F100 at 150° C. was somewhat high, thermoformability as a protection film was inferior, and the gloss of a molded article after forming was affected, but a molded article that appearance was a problem-free level could be obtained.

Example 11

A three layer laminated film of A layer/B layer/A layer was produced. As polyester A composing A layer, it was used by mixing PET, PETG and PETM by a mass ratio of 86.5:10:3.5. As polyester B composing B layer, it was used by mixing PET and PTT by a mass ratio of 80:20.

A biaxially oriented polyester film of 25 μm in film thickness was obtained in the same manner as in Example 1 except the stretching ratio in the longitudinal direction was 3.5 times, the relaxation in a tenter was 1% and the heat treatment temperature was 222° C.

The biaxially oriented polyester film obtained was excellent in formability and appearance after metal deposition by the condition of (10). However, since beat-shrinkable stress was high, interlayer adhesion after forming was somewhat inferior.

The characteristic as a protection film evaluated by the condition of (11) was also good, and a molded article that formability was excellent, the lowering of gloss of a molded article after forming was small and appearance was excellent could be obtained.

Comparative Example 1

A three layer laminated film of A layer/B layer/A layer was produced. As polyester A composing A layer, it was used by mixing PET and PETM by a mass ratio of 98.5:1.5. As polyester B composing B layer, it was used by mixing PET, PBT and PETG by a mass ratio of 45:20:35.

A biaxially oriented polyester film of 30 μm in film thickness was obtained in the same manner as in Example 1 except the heat treatment temperature was set at 210° C.

The biaxially oriented polyester film obtained was inferior in interlayer adhesion after forming because Tmeta was low and, the compositions of A layer and B layer differed largely.

Comparative Example 2

A three layer laminated film of A layer/B layer/A layer was produced. As polyester A composing A layer, it was used by mixing PET and PETM by a mass ratio of 99:1. As polyester B composing B layer, it was used by mixing PET and PETI by a mass ratio of 90:10.

A biaxially oriented polyester film of 25 μm in film thickness was obtained in the same manner as in Example 1 except the stretching ratio in the longitudinal direction was set to 3.3 times.

The biaxially oriented polyester film obtained had a high F100 value, and formability was inferior. Since heat-shrinkable stress at 200° C. in the longitudinal direction was high, some delaminaion occurred in the vicinity of burr in a peel test after forming. Thermoformability as a protection film was inferior, and the gloss of a molded article after forming was low.

Comparative Example 3

A three layer laminated film of A layer/B layer/A layer was produced. As polyester A composing A layer, it was used by mixing PET, PETG and PETM by a mass ratio of 75:20:5. As polyester B composing B layer, it was used by mixing PET and PBT by a mass ratio of 90:10.

A biaxially oriented polyester film of 30 μm in film thickness was obtained in the same manner as in Example 1 except the stretching temperature in the longitudinal direction was 95° C. and the heat treatment temperature was 235° C.

The biaxially oriented polyester film obtained had a high F100 value at 200° C., and formability was inferior, since the compositions of A layer and B layer differed largely, interlayer adhesion after forming was inferior, and since haze was high, appearance after metal deposition by the condition of (10) was somewhat inferior. Thermoformability as a protection film was inferior, and the gloss of a molded article after forming was low.

Comparative Example 4

A two layer laminated film of A layer/B layer was produced. As polyester A composing A layer, it was used by mixing PET and PETM by a mass ratio of 94:6. As polyester B composing B layer, it was used by mixing PET, PBT and PTT by a mass ratio of 70:15:15.

A biaxially oriented polyester film of 25 μm in film thickness was obtained in the same manner as in Example 1 except that the heat treatment temperature was set at 215° C.

The biaxially oriented polyester film obtained was inferior in interlayer adhesion after forming because Tmeta was low, and since haze was high, appearance after metal deposition by the condition of (10) was somewhat inferior.

Comparative Example 5

A three layer laminated film of A layer/B layer/A layer was produced. As polyester A composing A layer, it was used by mixing PET, PETG and PETM by a mass ratio of 68:30:2. As polyester B composing B layer, it was used by mixing PET, PTT and PEM by a mass ratio of 89.5:10:0.5.

A biaxially oriented polyester film of 30 μm in film thickness was obtained in the same manner as in Example 1 except that the heat treatment temperature was set at 220° C.

The biaxially oriented polyester film obtained had a low F100 value at 200° C., but a high F100, value at 150° C., thermoformability as a protection film was inferior, and the gloss of a molded article after forming was low.

From Tables, in Examples satisfying the requirement of the present invention, formability was excellent, no delamination in a peel test after forming occurred, and appearance before and after forming was excellent. Further, excellent formability as a protection film was exhibited, and a product that the gloss of the molded article obtained was high and appearance was excellent could be obtained. On the other hand, in Comparative Examples, formability was inferior, delamination in a peel test after forming occurred, and appearance after forming was inferior.

TABLE 1

|  |  |  | Example 1 | Example 2 | Example 3 | Example 4 |
|---|---|---|---|---|---|---|
| A layer | Polyester A |  | PET (34 mass %) | PET (33.4 mass %) | PET (37 mass %) | PET (93.5 mass %) |
|  |  |  | PBT (25 mass %) | PETG (65 mass %) | PETG (60 mass %) | PBT (5 mass %) |
|  |  |  | PETG (40 mass %) | PETM (1.6 mass %) | PETM (3 mass %) | PETM (1.5 mass %) |
|  |  |  | PETM (1 mass %) |  |  |  |
|  | Composition | Glycol component | EG (72.5 mole %) | EG (92.8 mole %) | EG (93.2 mole %) | EG (93.7 mole %) |
|  |  |  | DEG (1.5 mole %) | DEG (2 mole %) | DEG (2 mole %) | DEG (1.9 mole %) |
|  |  |  | BG (22.7 mole %) | CHDM (5.2 mole %) | CHDM (4.8 mole %) | BG (4.4 mole %) |
|  |  |  | CHDM (3.3 mole %) |  |  |  |
|  |  | Acid component | TPA (100%) | TPA (100%) | TPA (100%) | TPA (100%) |
|  | Glass transition temperature (° C.) |  | 76 | 78 | 77 | 77 |
| B layer | Polyester B |  | PET (34.8 mass %) | PET (45 mass %) | PET (50 mass %) | PET (70 mass %) |
|  |  |  | PBT (25 mass %) | PBT (20 mass %) | PBT (15 mass %) | PBT (15 mass %) |
|  |  |  | PETG (40 mass %) | PETG (35 mass %) | PETG (35 mass %) | PTT (15 mass %) |
|  |  |  | PETM (0.2 mass %) |  |  |  |
|  | Composition | Glycol component | EG (72.5 mole %) | EG (77.5 mole %) | EG (82.0 mole %) | EG (70.6 mole %) |
|  |  |  | DEG (1.5 mole %) | DEG (1.6 mole %) | DEG (1.7 mole %) | DEG (1.4 mole %) |
|  |  |  | BG (22.7 mole %) | BG (18.0 mole %) | BG (13.5 mole %) | BG (13.5 mole %) |
|  |  |  | CHDM (3.3 mole %) | CHDM (2.9 mole %) | CHDM (2.8 mole %) | PG (14.5 mole %) |
|  |  | Acid component | TPA (100%) | TPA (100 mole %) | TPA (100 mole %) | TPA (100 mole %) |
|  | Melting point (° C.) |  | 247 | 246 | 248 | 246 |
| C layer | Polyester C |  | — | — | — | — |
|  | Composition | Glycol component |  |  |  |  |
|  |  | Acid component |  |  |  |  |
|  | Glass transition temperature (° C.) |  |  |  |  |  |
| Lamination | Layer constitution |  | A/B/A | A/B/A | A/B | A/B/A |
|  | Lamination thickness (μm) |  | 1.5 | 4 | 11 | 2.5 |
|  | Lamination ratio |  | 0.06 | 0.16 | 0.44 | 0.125 |
| Tmeta (° C.) |  |  | 243 | 240 | 238 | 215 |
| Interlayer adhesion | Before forming |  | 21.0* | 19.8 | 18.7 | 7.9 |
| (N/15 mm) | After forming |  | 20.3* | 19.5 | 18.8 | 6.6 |
| F100 (MPa) | 150° C. |  | 24/27 | 26/30 | 30/44 | 16/19 |
| (MD/TD) | 200° C. |  | 10/16 | 11/27 | 14/31 | 8/13 |
| Tensile elongation at | 150° C. |  | 308/297 | 287/265 | 266/224 | 361/320 |
| break (%) | 200° C. |  | 325/309 | 317/290 | 274/241 | 370/324 |
| (MD/TD) |  |  |  |  |  |  |
| Heat-shrinkable stress (MD/TD) (MPa) |  |  | 0.01/0.01 | 0.02/0.02 | 0.01/0.04 | 0.03/0.01 |
| Haze (%/μm) |  |  | 0.04 | 0.06 | 0.17 | 0.05 |

*No delamination occurred (value of interlayer adhesion shows adhesive strength of an adhesive)

TABLE 2

|  |  |  | Example 5 | Example 6 | Example 7 | Example 8 |
|---|---|---|---|---|---|---|
| A LAYER | Polyester A |  | PET (64 mass %) PBT (15 mass %) PETG (20 mass %) PETM (1 mass %) | PET (45 mass %) PETG (50 mass %) PETM (5 mass %) | PET (58.8 mass %) PETG (40 mass %) PETM (1.2 mass %) | PET (68 mass %) PBT (30 mass %) PETM (2 mass %) |
|  | Composition | Glycol component | EG (83.2 mole %) DEG (1.7 mole %) BG (13.5 mole %) CHDM (1.6 mole %) | EG (94 mole %) DEG (2 mole %) CHDM (4 mole %) | EG (94.8 mole %) DEG (2 mole %) CHDM (3.2 mole %) | EG (68.6 mole %) DEG (1.4 mole %) BG (30 mole %) |
|  |  | Acid component | TPA (100%) | TPA (100%) | TPA (100%) | TPA (100%) |
|  | Glass transition temperature (° C.) |  | 77 | 78 | 78 | 64 |
| B LAYER | Polyester B |  | PET (85 mass %) PBT (15 mass %) | PET (80 mass %) PBT (15 mass %) PETI (5 mass %) | PET (90 mass %) PBT (10 mass %) | PET (50 mass %) PTT (20 mass %) PETG (30 mass %) |
|  | Composition | Glycol component | EG (84.9 mole %) DEG (1.7 mole %) BG (13.4 mole %) | EG (83.3 mole %) DEG (1.7 mole %) BG (15 mole %) | EG (88.2 mole %) DEG (1.8 mole %) BG (10 mole %) | EG (76 mole %) DEG (1.6 mole %) PG (20 mole %) CHDM (2.4 mole %) |
|  |  | Acid component | TPA (100 mole %) | TPA (99.1 mole %) IPA (0.9) | TPA (100 mole %) | TPA (100 mole %) |
|  | Melting point (° C.) |  | 253 | 252 | 254 | 244 |
| C LAYER | Polyester C |  | PET (94 mass %) PTT (5 mass %) PETM (1 mass %) | — | — | — |
|  | Composition | Glycol component | EG (93.4 mole %) DEG (1.9 mole %) PG (4.7 mole %) |  |  |  |
|  |  | Acid component | TPA (100 mole %) |  |  |  |
|  | Glass transition temperature (° C.) |  | 78 |  |  |  |
| Lamination | Layer constitution |  | A/B/C | A/B | A/B/A | A/B/A |
|  | Lamination thickness |  | 6 | 5.5 | 4 | 2 |
|  | Lamination ratio |  | 0.3 | 0.22 | 0.16 | 0.05 |
| Tmeta (° C.) |  |  | 235 | 237 | 228 | 240 |
| Interlayer adhesion (N/15 mm) | Before forming |  | 9.7 | 14.4 | 10.5 | 14.7 |
|  | After forming |  | 7.8 | 14.2 | 4.1 | 11.9 |
| F100 (MPa) (MD/TD) | 150° C. |  | 39/48 | 29/39 | 48/46 | 15/22 |
|  | 200° C. |  | 31/41 | 24/37 | 43/40 | 13/19 |
| Tensile elongation at break (%) (MD/TD) | 150° C. |  | 210/204 | 217/248 | 169/181 | 324/299 |
|  | 200° C. |  | 229/217 | 234/266 | 177/190 | 340/305 |
| Heat-shrinkable stress (MD/TD) (MPa) |  |  | 0.12/0.08 | 0.08/0.05 | 0.18/0.14 | 0.04/0.07 |
| Haze (%/μm) |  |  | 0.03 | 0.22 | 0.04 | 0.14 |

TABLE 3

|  |  |  | Example 9 | Example 10 | Example 11 |
|---|---|---|---|---|---|
| A LAYER | Polyester A |  | PET (78.2 mass %) PETG (20 mass %) PETM (1.8 mass %) | PET (58.3 mass %) PETG (40 mass %) PETM (1.7 mass %) | PET (86.5 mass %) PETG (10 mass %) PETM (3.5 mass %) |
|  | Composition | Glycol component | EG (96.4 mole %) DEG (2 mole %) CHDM (1.6 mole %) | EG (94.8 mole %) DEG (2 mole %) CHDM (3.2 mole %) | EG (97.2 mole %) DEG (2 mole %) CHDM (0.8 mole %) |
|  |  | Acid component | TPA (100%) | TPA (100%) | TPA (100%) |
|  | Glass transition temperature (° C.) |  | 77 | 78 | 77 |
| B LAYER | Polyester B |  | PET (70 mass %) PBT (20 mass %) PETG (10 mass %) | PET (40 mass %) PETG (60 mass %) | PET (80 mass %) PTT (20 mass %) |
|  | Composition | Glycol component | EG (77.6 mole %) DEG (1.6 mole %) BG (20 mole %) CHDM (0.8 mole %) | EG (93.2 mole %) DEG (2 mole %) CHDM (4.8 mole %) | EG (78.4 mole %) DEG (1.6 mole %) PG (20 mole %) |
|  |  | Acid component | TPA (100 mole %) | TPA (100%) | TPA (100%) |
|  | Melting point (° C.) |  | 251 | 246 | 250 |
| C LAYER | Polyester C |  | — | — | — |
|  | Composition | Glycol component |  |  |  |
|  |  | Acid component |  |  |  |
|  | Glass transition temperature (° C.) |  |  |  |  |

TABLE 3-continued

|  |  |  | Example 9 | Example 10 | Example 11 |
|---|---|---|---|---|---|
| Lamination | Layer constitution |  | A/B/A | A/B/A | A/B/A |
|  | Lamination thickness |  | 5 | 3 | 2.5 |
|  | Lamination ratio |  | 0.2 | 0.2 | 0.1 |
| Tmeta (° C.) |  |  | 218 | 235 | 222 |
| Interlayer adhesion (N/15 mm) |  | Before forming | 5.8 | 13.6 | 5.3 |
|  |  | After forming | 5.5 | 12.4 | 2.9 |
| F100 (MPa) (MD/TD) |  | 150° C. | 30/38 | 37/50 | 22/31 |
|  |  | 200° C. | 25/33 | 34/44 | 18/27 |
| Tensile elongation at break (%) (MD/TD) |  | 150° C. | 199/189 | 140/131 | 311/302 |
|  |  | 200° C. | 210/194 | 169/157 | 325/318 |
| Heat-shrinkable stress (MD/TD) (MPa) |  |  | 0.02/0.02 | 0.06/0.05 | 0.15/0.15 |
| Haze (%/μm) |  |  | 0.08 | 0.04 | 0.15 |

TABLE 4

|  |  |  | Comparative example 1 | Comparative example 2 | Comparative example 3 | Comparative example 4 |
|---|---|---|---|---|---|---|
| A LAYER | Polyester A |  | PET (98.5 mass %) PETM (1.5 mass %) | PET (99 mass %) PETM (1 mass %) | PET (75 mass %) PETG (20 mass %) PETM (5 mass %) | PET (94 mass %) PETM (6 mass %) |
|  | Composition | Glycol component | EG (98 mole %) DEG (2 mole %) | EG (98 mole %) DEG (2 mole %) | EG (96.4 mole %) DEG (2 mole %) CHDM (1.6 mole %) | EG (98 mole %) DEG (2 mole %) |
|  |  | Acid component | TPA (100%) | TPA (100%) | TPA (100%) | TPA (100%) |
|  | Glass transition temperature (° C.) |  | 78 | 78 | 77 | 78 |
| B LAYER | Polyester B |  | PET (45 mass %) PBT (20 mass %) PETG (35 mass %) | PET (90 mass %) PETI (10 mass %) | PET (90 mass %) PBT (10 mass %) | PET (70 mass %) PBT (15 mass %) PTT (15 mass %) |
|  | Composition | Glycol component | EG (75.6 mole %) DEG (1.6 mole %) BG (20 mole %) CHDM (2.8 mole %) | EG (98 mole %) DEG (2 mole %) | EG (88.2 mole %) DEG (1.8 mole %) BG (10 mole %) | EG (68.6 mole %) DEG (1.4 mole %) BG (15 mole %) PG (15 mole %) |
|  |  | Acid component | TPA (100 mole %) | TPA (98.3 mole %) IPA (1.7 mole %) | TPA (100 mole %) | TPA (100 mole %) |
|  | Melting point (° C.) |  | 246 | 254 | 254 | 244 |
| C LAYER | Polyester C |  | — | — | — | — |
|  | Composition | Glycol component |  |  |  |  |
|  |  | Acid component |  |  |  |  |
|  | Glass transition temperature (° C.) |  |  |  |  |  |

TABLE 4-continued

|  |  | Comparative example 1 | Comparative example 2 | Comparative example 3 | Comparative example 4 |
|---|---|---|---|---|---|
| Lamination | Layer constitution | A/B/A | A/B/A | A/B/A | A/B |
|  | Lamination thickness | 3 | 4 | 2.5 | 3 |
|  | Lamination ratio | 0.1 | 0.16 | 0.08 | 0.12 |
| Tmeta (° C.) |  | 210 | 243 | 235 | 215 |
| Interlayer adhesion (N/15 mm) | Before forming | 4.7 | 10.5 | 4.2 | 3.9 |
|  | After forming | 2.4 | 9.2 | 2.1 | 2.8 |
| F100 (MPa) (MD/TD) | 150° C. | 24/34 | 72/84 | 56/70 | 24/28 |
|  | 200° C. | 18/29 | 61/73 | 47/62 | 19/23 |
| Tensile elongation at break (%) (MD/TD) | 150° C. | 255/247 | 150/119 | 182/169 | 232/288 |
|  | 200° C. | 287/264 | 153/128 | 190/175 | 240/301 |
| Heat-shrinkable stress (MD/TD) (MPa) |  | 0.04/0.03 | 0.17/0.12 | 0.1/0.07 | 0.05/0.02 |
| Haze (%/μm) |  | 0.06 | 0.02 | 0.24 | 0.3 |

TABLE 5

|  |  | Comparative example 5 |
|---|---|---|
| A LAYER | Polyester A | PET (68 mass %) PETG (30 mass %) PETM (2 mass %)) |
|  | Composition Glycol component | EG (95.6 mole %) DEG (2 mole %) CHDM (2.4 mole %) |
|  | Acid component | TPA (100%) |
|  | Glass transition temperature (° C.) | 77 |
| B LAYER | Polyester B | PET (89.5 mass %) PTT (10 mass %) PETM (0.5 mass %) |
|  | Composition Glycol component | EG (88.2 mole %) DEG (1.8 mole %) PG (10 mole %) |
|  | Acid component | TPA (100 mole %) |
|  | Melting point (° C.) | 246 |
| C LAYER | Polyester C | — |
|  | Composition Glycol component |  |
|  | Acid component |  |
|  | Glass transition temperature (° C.) |  |
| Lamination | Layer constitution | A/B/A |
|  | Lamination thickness | 2 |
|  | Lamination ratio | 0.067 |
| Tmeta (° C.) |  | 220 |
| Interlayer adhesion (N/15 mm) | Before forming | 17.4 |
|  | After forming | 15.6 |
| F100 (MPa) (MD/TD) | 150° C. | 52/57 |
|  | 200° C. | 42/49 |
| Tensile elongation at break (%) (MD/TD) | 150° C. | 206/194 |
|  | 200° C. | 223/207 |
| Heat-shrinkable stress (MD/TD) (MPa) |  | 0.07/0.05 |
| Haze (%/μm) |  | 0.07 |

Herein, brevity codes in Tables are as follow.
EG: ethylene glycol residue component
DEG: diethylene glycol residue component
BD: 1,4-butanediol residue component
PG: 1,3-propylene glycol residue component
CHDM: 1,4-cyclohexanedimethanol residue component
TPA: terephthalic acid residue component
IPA: isophthalic acid residue component
F100: stress at 100% elongation
Tmeta: small endotherm peak before crystal melting

TABLE 6

|  | Example 1 | Example 2 | Example 3 | Example 4 |
|---|---|---|---|---|
| Delamiantion peel test after forming | Excellent | Excellent | Excellent | Good |
| Appearance after metal deposition | Excellent | Excellent | Good | Excellent |
| Characteristic as protection film | Excellent | Excellent | Good | Excellent |

TABLE 7

|  | Example 5 | Example 6 | Example 7 | Example 8 |
|---|---|---|---|---|
| Delamiantion peel test after forming | Good | Excellent | Good | Excellent |
| Appearance after metal deposition | Excellent | Good | Excellent | Good |
| Characteristic as protection film | Pass | Good | Pass | Excellent |

TABLE 8

|  | Example 9 | Example 10 | Example 11 |
|---|---|---|---|
| Delamiantion peel test after forming | Good | Excellent | Good |
| Appearance after metal deposition | Excellent | Excellent | Good |
| Characteristic as protection film | Good | Pass | Excellent |

TABLE 9

|  | Comparative example 1 | Comparative example 2 | Comparative example 3 | Comparative example 4 |
|---|---|---|---|---|
| Delamiantion peel test after forming | Bad | Good | Bad | Bad |
| Appearance after metal deposition | Excellent | Excellent | Bad | Bad |
| Characteristic as protection film | Excellent | Bad | Bad | Excellent |

TABLE 10

|  | Comparative example 5 |
|---|---|
| Delamiantion peel test after forming | Excellent |
| Appearance after metal deposition | Excellent |
| Characteristic as protection film | Bad |

INDUSTRIAL APPLICABILITY

The biaxially oriented polyester film for molded part of the present invention is easy to process by thermoforming, and thermal dimensional stability is excellent, thus, metal deposition can be easily conducted uniformly, further since appearance change before and after thermoforming is small and no delamination occurs, so it can be used suitably as a metallic molded component and a surface protection film in forming a formable decorative sheet.

The invention claimed is:

1. A biaxially oriented polyester film for a molded part comprising a polyester film that has at least layer A and layer B, wherein layer A comprises polyester A, layer B comprises polyester B, and layer A and layer B are laminated together,
    interlayer adhesion between layer A and layer B is 5 N/15 mm or more,
    stress at 100% elongation (F100 value) at 200° C. and 150° C. in longitudinal and transverse directions of the film is 1 to 50 MPa, and
    tensile elongation at break at 200° C. and 150° C. in the longitudinal direction and transverse direction of the film is 150 to 400%.

2. The biaxially oriented polyester film according to claim 1, comprising layer A, layer B and a layer C.

3. The biaxially oriented polyester film according to claim 1, wherein interlayer adhesion between layer A and layer B after being stretched at 200° C. by 1.2 times in the longitudinal direction and transverse direction of the film is 3 N/15 mm or more.

4. The biaxially oriented polyester film according to claim 1, wherein glycol residue components constituting polyester B comprise:
    glycol residue component Ba: ethylene glycol residue of 60 to 90 mole %,
    glycol residue component Bb1: 1,4-butanediol residue of 9 to 40 mole %, and
    glycol residue component Bb2: other glycol component different from Ba and Bb1 of 1 to 20 mole %.

5. The biaxially oriented polyester film according to claim 4, wherein glycol residue component Bb2 contains 1,4-cyclohexanedimethanol residue component.

6. The biaxially oriented polyester film according to claim 1, wherein glycol residue components constituting polyester A comprise:
    glycol residue component Aa: ethylene glycol residue of 60 to 90 mole %, and
    glycol residue component Ab: other glycol component different from glycol residue component Aa of 10 to 40 mole %.

7. The biaxially oriented polyester film according to claim 1, wherein glycol residue components constituting polyester A comprise:
    glycol residue component Aa: ethylene glycol residue of 60 to 90 mole %,
    glycol residue component Ab1: 1,4-butanediol residue of 9 to 40 mole %, and
    glycol residue component Ab2: other glycol component different froth Aa and Ab1 of 1 to 20 mole %.

8. The biaxially oriented polyester film according to claim 7, wherein glycol residue component Ab2 contains 1,4-cyclohexanedimethanol residue component.

9. The biaxially oriented polyester film according to claim 1, having a haze of 0.01 to 02%/μm.

10. The biaxially oriented polyester film according to claim 1, wherein heat-shrinkable stress at 200° C. in the longitudinal direction and transverse direction is 0 to 0.16 MPa.

11. A film for a metallic molded part, comprising a metal compound deposited on at least one surface of the biaxially oriented polyester film according to claim 1.

12. The biaxially oriented polyester film according to claim 1, laminated on a surface of a formable decorative sheet.

13. A formable laminate comprising the biaxially oriented polyester film according to claim 1, laminated on a surface of a formable decorative sheet.

14. A method of forming a molded part comprising preforming the formable laminate according to claim 13; trimming said perform laminate; and injecting a resin into said trimmed laminate to obtain a Molded article, and the peeling the biaxially oriented polyester film from said molded article to obtain the molded part.

15. A molded part obtained by peeling the biaxially oriented polyester film from a molded article after obtaining the molded article by forming the formable laminate according to claim 13, wherein an absolute value of difference in surface gloss from a formable decorative sheet before forming is less than 10.

* * * * *

UNITED STATES PATENT AND TRADEMARK OFFICE
CERTIFICATE OF CORRECTION

PATENT NO. : 8,354,171 B2
APPLICATION NO. : 12/297332
DATED : January 15, 2013
INVENTOR(S) : Manabe et al.

It is certified that error appears in the above-identified patent and that said Letters Patent is hereby corrected as shown below:

In the Claims

In Column 36

At line 33, in claim 9, please change "02% μm" to --0.2% μm--.

Signed and Sealed this
Twenty-fifth Day of June, 2013

Teresa Stanek Rea
*Acting Director of the United States Patent and Trademark Office*